United States Patent
Chung

(10) Patent No.: US 11,133,318 B2
(45) Date of Patent: Sep. 28, 2021

(54) SEMICONDUCTOR STRUCTURE AND MANUFACTURING METHOD OF THE SAME

(71) Applicant: NANYA TECHNOLOGY CORPORATION, New Taipei (TW)

(72) Inventor: Lu-Wei Chung, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/561,790

(22) Filed: Sep. 5, 2019

(65) Prior Publication Data

US 2020/0168614 A1 May 28, 2020

Related U.S. Application Data

(60) Provisional application No. 62/772,378, filed on Nov. 28, 2018.

(51) Int. Cl.
| | |
|---|---|
| *H01L 29/792* | (2006.01) |
| *H01L 27/108* | (2006.01) |
| *H01L 21/768* | (2006.01) |
| *H01L 21/02* | (2006.01) |
| *H01L 23/532* | (2006.01) |

(52) U.S. Cl.
CPC .. *H01L 27/10885* (2013.01); *H01L 21/02063* (2013.01); *H01L 21/7682* (2013.01); *H01L 21/76814* (2013.01); *H01L 23/5329* (2013.01); *H01L 27/10814* (2013.01)

(58) Field of Classification Search
None
See application file for complete search history.

(56) References Cited

U.S. PATENT DOCUMENTS

| | | | |
|---|---|---|---|
| 5,914,519 A | 6/1999 | Chou et al. | |
| 2012/0135586 A1* | 5/2012 | Kim | H01L 27/10885 |
| | | | 438/513 |
| 2018/0166450 A1* | 6/2018 | Kim | H01L 27/10885 |
| 2018/0286870 A1* | 10/2018 | Kim | H01L 27/10885 |

OTHER PUBLICATIONS

Office Action corresponding to Taiwanese application No. 108134213 dated Apr. 28, 2021. (pp. 7).

* cited by examiner

*Primary Examiner* — Ali Naraghi
(74) *Attorney, Agent, or Firm* — Muncy, Geissler, Olds & Lowe, P.C.

(57) ABSTRACT

The present disclosure provides a semiconductor structure. The semiconductor structure includes: a polysilicon layer, having a first surface and a second surface opposite to the first surface; a substrate, disposed on the second surface of the polysilicon layer; a bit line structure, disposed on the substrate, penetrating through the polysilicon layer and protruding from the first surface of the polysilicon layer; and a spacer structure, disposed on lateral sidewalls of the bit line structure, including an air gap sandwiched by a first dielectric layer and a second dielectric layer, wherein a first portion of the second dielectric layer is in the polysilicon layer, a second portion of the second dielectric layer is outside the polysilicon layer, and a thickness of the second portion of the second dielectric layer is less than a thickness of the first portion of the second dielectric layer.

9 Claims, 20 Drawing Sheets

SEMICONDUCTOR STRUCTURE AND MANUFACTURING METHOD OF THE SAME

PRIORITY CLAIM AND CROSS-REFERENCE

This application claims priority to U.S. provisional application Ser. No. 62/772,378, filed on Nov. 28, 2018, entitled of "SEMICONDUCTOR STRUCTURE AND MANUFACTURING METHOD OF THE SAME", the disclosure of which is hereby incorporated by reference in its entirety.

TECHNICAL FIELD

The present disclosure relates to a semiconductor structure and semiconductor manufacturing, and more particularly to a trench capacitor of a dynamic random access memory (DRAM) with an air s gap for preventing parasitic leakage and a method for forming the trench capacitor.

DISCUSSION OF THE BACKGROUND

A conventional dynamic random access memory (DRAM) cell 100, as shown in FIG. 1, consists of a transistor T and a capacitor C. The source of the transistor T is connected to a corresponding bit line BL. The drain of the transistor T is connected to a storage electrode of the capacitor C. The gate of the transistor T is connected to a corresponding word line WL. An opposite electrode of the capacitor C is biased with a constant voltage source.

However, as the DRAM cells become increasingly small, the highly compact structures of the DRAM cells result in high parasitic capacitance between a bit line and a cell plate of a trench capacitor of the DRAM cell, thereby causing parasitic leakage.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes: a polysilicon layer, having a first surface and a second surface opposite to the first surface; a substrate, disposed on the second surface of the polysilicon layer; a bit line structure, disposed on the substrate, penetrating the polysilicon layer and protruding from the first surface of the polysilicon layer; and a spacer structure, disposed on lateral sidewalls of the bit line structure, including an air gap sandwiched by a first dielectric layer and a second dielectric layer, wherein a first portion of the second dielectric layer is in the polysilicon layer, a second portion of the second dielectric layer is outside the polysilicon layer, and a thickness of the second portion of the second dielectric layer is less than that of the first portion of the second dielectric layer.

In some embodiments, the semiconductor structure further includes: a metal layer, disposed on the first surface of the polysilicon layer, covering a first sub-portion of the first portion of the second dielectric layer.

In some embodiments, the first portion of the second dielectric layer further includes a second sub-portion exposed through the metal layer, and a thickness of the second sub-portion is less than that of the first sub-portion.

In some embodiments, the second dielectric layer has a tapered configuration.

In some embodiments, the semiconductor structure further includes a linear layer, disposed on the first surface of the polysilicon layer, wherein the linear layer covers the bit line structure and the spacer structure to seal the gap.

In some embodiments, the thickness of the second portion of the second dielectric layer is less than the thickness of the first portion of the second dielectric layer by an amount in a range of 0.5 to 2 nanometers.

In some embodiments, the air gap has a width in a range of 3 to 5 nanometers.

In some embodiments, the thickness of the second portion of the first dielectric layer is in a range from 5.5 to 12 nanometers.

In some embodiments, the thickness of the second portion of the first dielectric layer is in a range from 4 to 10.5 nanometers.

Another aspect of the present disclosure provides a method of manufacturing a semiconductor structure. The method includes:

receiving a substrate; forming a bit line structure on a top surface of the substrate; forming a spacer structure on the bit line structure, the spacer structure including a sacrificial layer sandwiched by a first dielectric layer and a second dielectric layer; removing the sacrificial layer to forth a gap between the first dielectric layer and the second dielectric layer; reducing a width of the gap; and forming a seal layer to seal the gap.

In some embodiments, a thickness of the first dielectric layer and a thickness of the second dielectric layer are increased to reduce the width of the gap.

In some embodiments, the thickness of the first dielectric layer is increased by 0.5 to 2 nanometers.

In some embodiments, the thickness of the first dielectric layer and the thickness of the second dielectric layer are increased by forming a third dielectric layer on sidewalls of the first dielectric layer and the second dielectric layer facing the gap.

In some embodiments, the first dielectric layer, the second dielectric layer and the third dielectric layer have the same material.

In some embodiments, material of the third dielectric layer is different from that of the first dielectric layer.

In some embodiments, a width of the gap after reduction is in a range of between 3 and 5 nanometers.

In some embodiments, the width of the gap is reduced by an atomic-layer deposition operation.

In some embodiments, the method further includes: after the forming of the spacer structure, forming a polysilicon layer on the top surface of the substrate, wherein the polysilicon layer covers a portion of the spacer structure; and, prior to the removal of the sacrificial layer, performing a cleaning operation on the substrate, wherein a portion of the second dielectric layer is removed.

In some embodiments, the portion of the second dielectric layer is removed such that a thickness of a portion of the second dielectric layer exposed through the poly-silicon layer is reduced.

With the above-mentioned configurations, the parasitic capacitance between the bit line and the cell plate is reduced to prevent parasitic leakage and thus improve the electrical performance of the DRAM.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
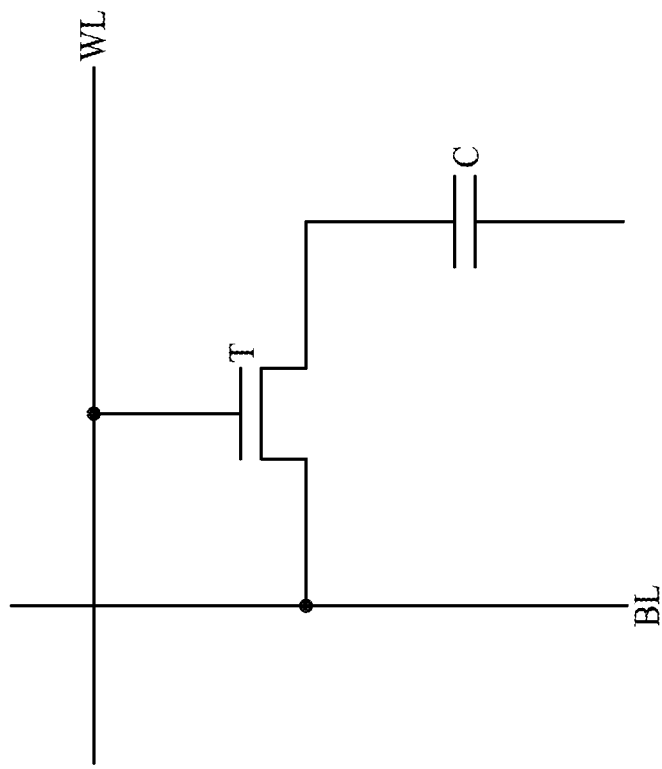
FIG. 1 shows a circuit diagram of a DRAM cell according to the prior art.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
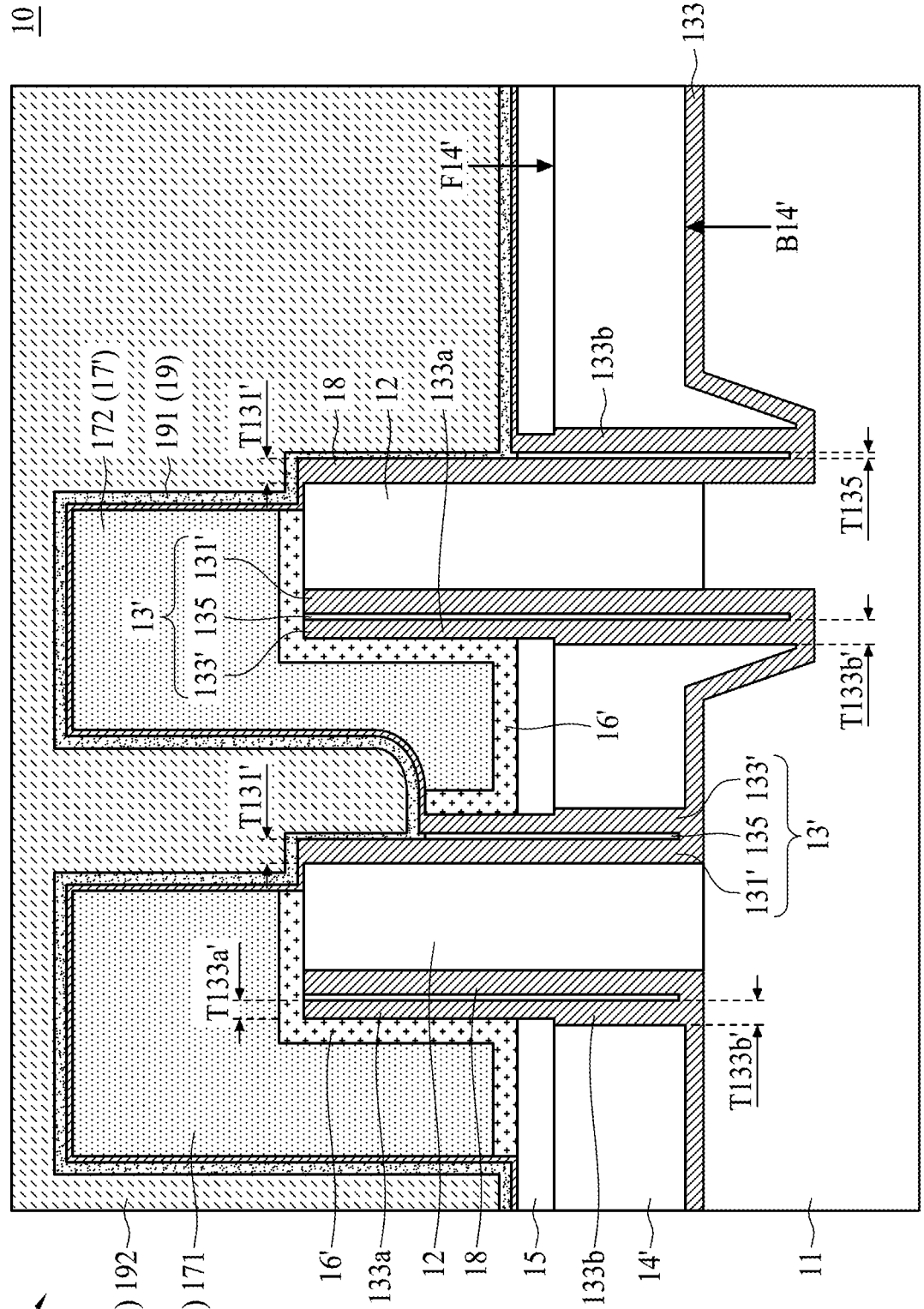
FIG. 2 is a cross-sectional view of a semiconductor structure in accordance with some embodiments of the present disclosure.

FIG. 2 is a cross-sectional view of a semiconductor structure 10 in accordance with some embodiments of the present disclosure. In some embodiments, the semiconductor structure 10 includes: a polysilicon layer 14', a substrate 11, a bit line structure 12, and a spacer structure 13'. The polysilicon layer 14' has a first surface F14' and a second surface B14', which is opposite to the first surface F14'. In some embodiments, the substrate 11 is disposed on the second surface B14' of the polysilicon layer 14'. In some embodiments, the bit line structure 12 is disposed on the substrate 11, penetrating through the polysilicon layer 14' and protruding from the first surface F14' of the polysilicon layer 14'. In some embodiments, the spacer structure 13' is disposed on lateral sidewalls of the bit line structure 12. In some embodiments, the spacer structure 13' includes an air gap 135 sandwiched by a first dielectric layer 131' and a spacer portion 133' of a second dielectric layer 133, wherein a protected portion 133b of the second dielectric layer 133 is in the polysilicon layer 14', a consumed portion 133a of the second dielectric layer 133 is outside the polysilicon layer 14', and a thickness T133a' of the consumed portion 133a of the second dielectric layer 133 is less than a thickness of T133b' of the protected portion 133b of the second dielectric layer 133. In some embodiments, a width T135 of the air gap is in a range from 3 to 5 nanometers. In some embodiments, the thickness T133a' of the consumed portion 133a is in a range from 4 to 8.5 nanometers. In some embodiments, the thickness T133b' of the protected portion 133b is in a range from 5.5 to 10 nanometers. In some embodiments, the a thickness T131' of the first dielectric layer 131' is in a range from 5.5 to 12 nanometers. In some embodiments, the thickness T131' of the first dielectric layer 131' is substantially equal to the thickness T133b' of the protected portion 133b.

Figure 3:
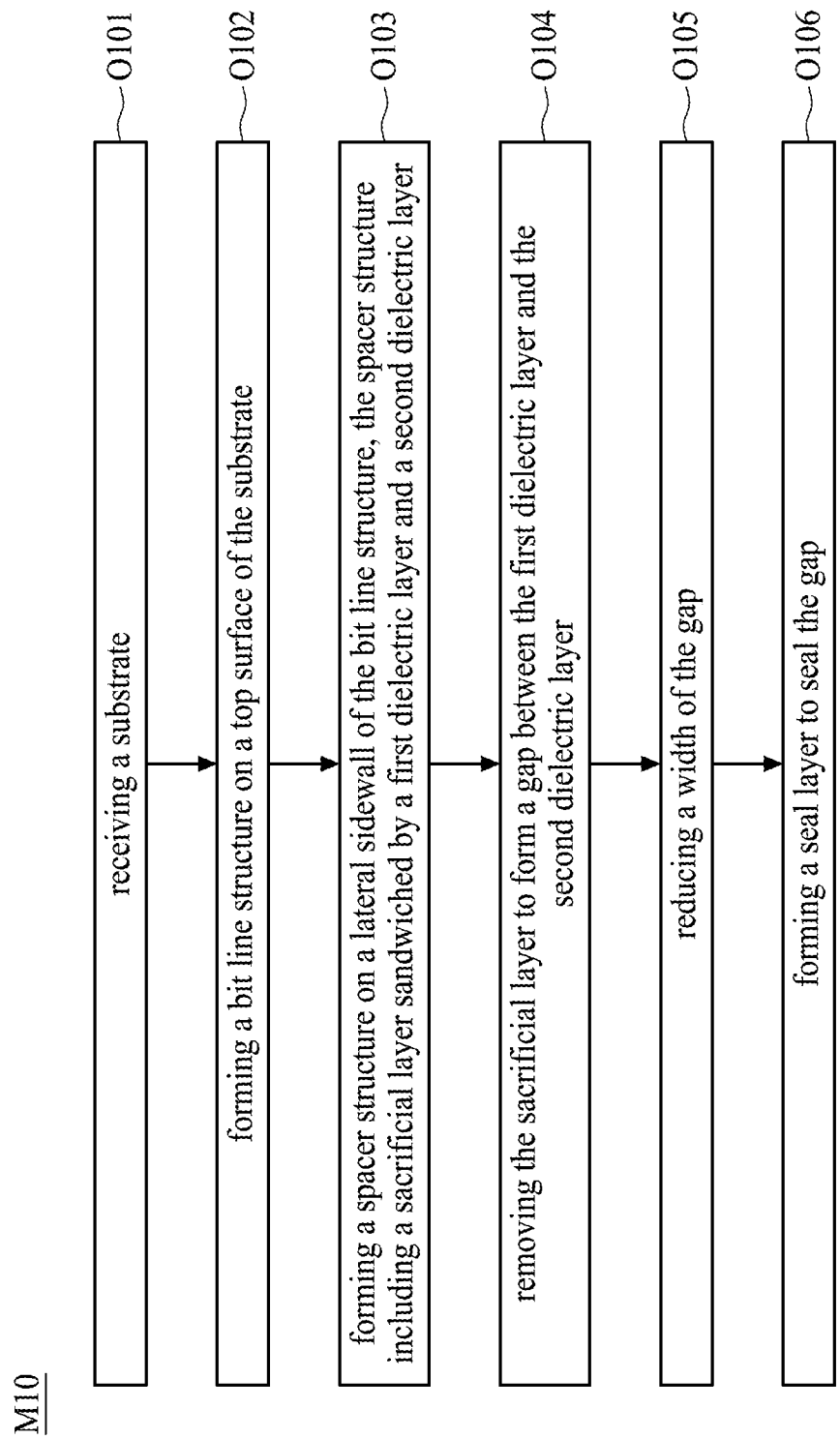
FIG. 3 is flowchart of a method for manufacturing a semiconductor structure in accordance with some embodiments of the present disclosure.

FIG. 3 is a flowchart of a method M10 for manufacturing a semiconductor structure similar to the semiconductor structure 10 shown in FIG. 2. The method M10 includes: (O101) receiving a substrate; (O102) forming a bit line structure on a top surface of the substrate; (O103) forming a spacer structure on a lateral sidewall of the bit line structure, the spacer structure including a sacrificial layer sandwiched by a first dielectric layer and a second dielectric layer; (O104) removing the sacrificial layer to form a gap between the first dielectric layer and the second dielectric layer; (O105) reducing a width of the gap; and (O106) forming a seal layer to seal the gap.

In order to further illustrate concepts of the present disclosure, various embodiments are provided below. However, it is not intended to limit the present disclosure to specific embodiments. In addition, conditions or parameters illustrated in different embodiments can be combined or modified to have different combinations of embodiments as long as the parameters or conditions used are not conflicted.

Figure 4:
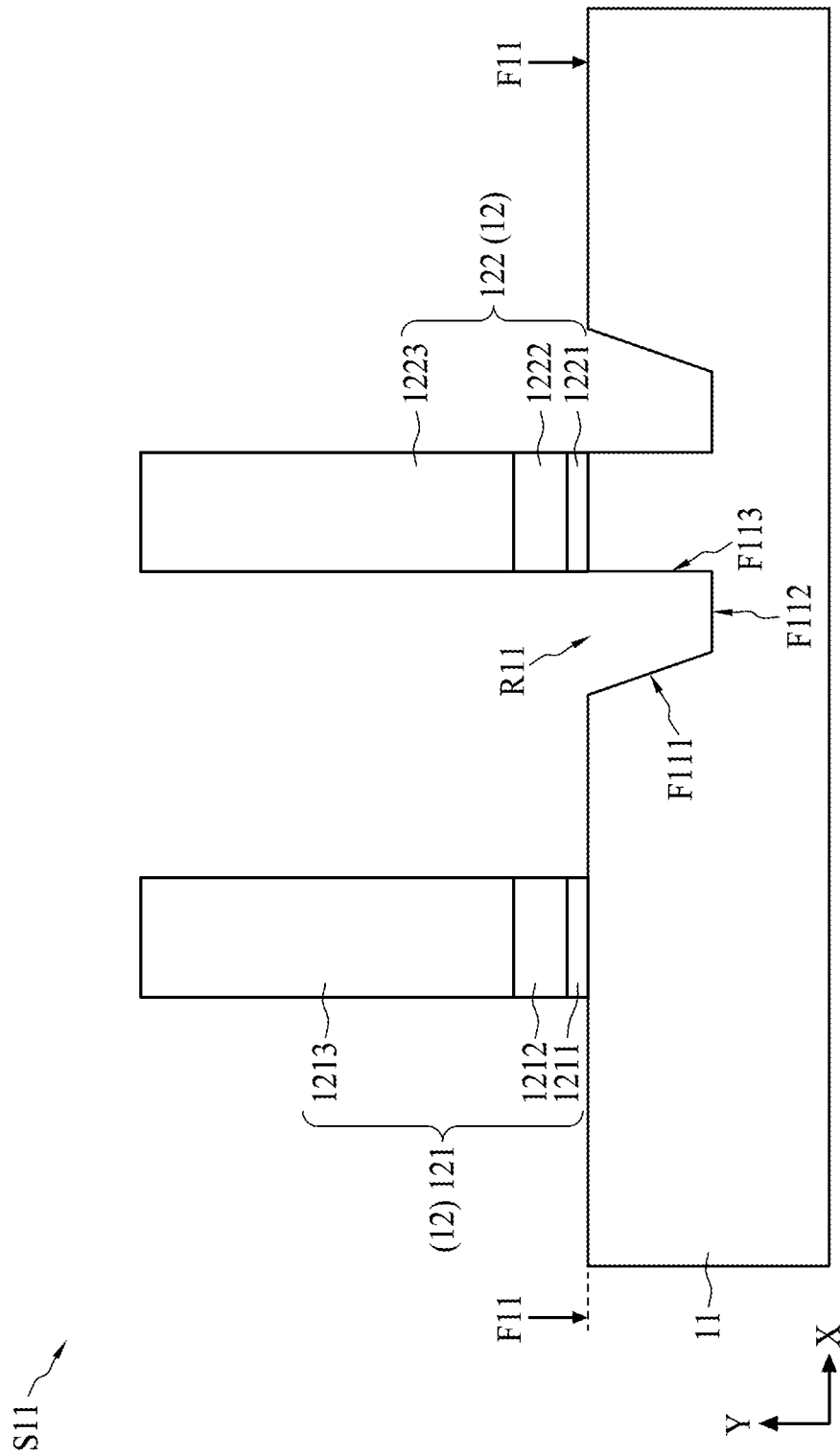
FIGS. 4 to 19 are schematic views of manufacturing a semiconductor structure by a method in accordance with some embodiments of the present disclosure.

Referring to FIG. 4, in accordance with some embodiments of the present disclosure and the operations O101 to O102 of the method M10, a substrate 11 is received or provided, and one or more bit line structures 12 are formed on a top surface F11 of the substrate 11. In some embodiments, a plurality of bit line structures 12 include a bit line structure 121 and a bit line structure 122. In some embodiments, as shown in FIG. 4, recessed portions R11 are formed on the top surface F11 of the substrate 11 adjacent to two lateral sides of the bit line structure 122, and the bit line structure 121 is formed on the planar portion of the top surface F11 of the substrate 11 with no recessed portions R11 nearby. In some embodiments, the recessed portion R11 includes a tilt surface F111, a bottom surface F112, and a vertical surface F113 (vertical referred to herein as a direction along the Y direction). In some embodiments, the vertical surface F113 is substantially coplanar to a lateral sidewall of the bit line structure 122. In some embodiments, the bottom surface F112 is substantially horizontal (horizontal referred to herein as a direction along the X direction), and is at a bottom of the recessed portion R11 of the top surface F11 and connects the tilt surface F111 and the vertical surface F113. The tilt surface F111 is opposite to the vertical surface F113 in the cross-sectional view, as shown in FIG. 4, and is connected to the vertical surface F111 by the bottom surface F112.

In some embodiments, the bit line structure 121 includes a metal nitride layer 1211 (e.g., a titanium nitride layer), a metal layer 1212 (e.g., a tungsten layer) and a hard mask layer 1213 (e.g. nitride layer) stacked in sequence on the top surface F11 of the substrate 11. In some embodiments, similar to the bit line structure 121, the bit line structure 122 also includes a metal nitride layer 1221 (e.g., a titanium nitride layer), a metal layer 1222 (e.g., a tungsten layer), a hard mask layer 1223 (e.g. nitride layer) stacked in sequence on the top surface F11 of the substrate 11.

In accordance with some embodiments of the preset disclosure, as shown in FIG. 4, the different bit line structures 121 and 122 are disposed adjacent to each other. However, the present disclosure is not limited thereto. In some embodiments, there are only bit lines having structures similar to the bit line structure 121 formed over the substrate 11. In some embodiments, a type of bit line structure (e.g. the bit line structure 121 or the bit line structure 122) is included. In some embodiments, bit lines having structures similar to the bit line structure 122 or the bit line structure 121 are formed over the substrate 11. In some embodiments, there is no recessed portion R11 formed adjacent to the bit line structure 122 and no recessed portion R11 formed adjacent to the bit line structure 121. In some embodiments, there are recessed portions R11 on the top surface F11 formed adjacent to the bit line structure 121. Details of arrangement of stacked materials of the bit line structures 12 or configurations of the top surface F11 of the substrate 11 are not limited herein and can be adjusted according to different applications.

In accordance with some embodiments and the operation O103, a spacer structure 13 is formed on a lateral sidewall of the bit line structure 12, as shown in FIGS. 5 to 8. For ease of understanding, the side of the substrate 11 over which the bit line structures 12 are disposed is referred to as the front side S11. For a purpose of clarity and simplicity, reference numbers of some elements may not be repeatedly labeled on all of the figures, and stacked layers of the bit line structures 121 and 122 are omitted in FIGS. 5 to 20, while only a pillar of the bit line structure 121 and a pillar of the bit line structure 122 are shown.

Figure 5:
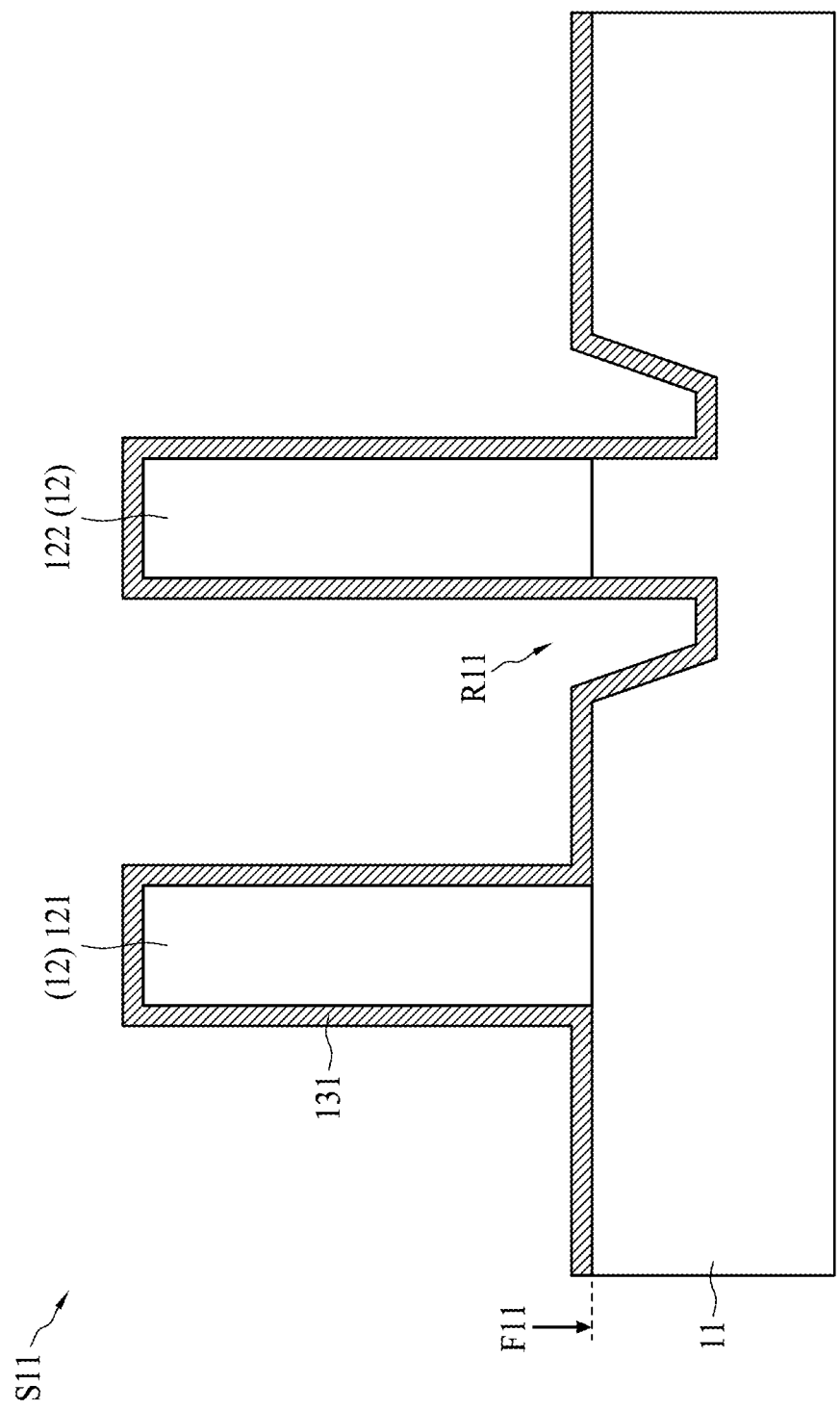

Referring to FIG. 5, a first dielectric layer 131 is formed on the front side S11 of the substrate 11. The first dielectric layer 131 is formed over the substrate 11 and the bit line structures 12, and conformal to a profile of the bit line structures 12 and the substrate 11. The first dielectric layer 131 is formed on the lateral sidewalls and covering the tops of the bit line structures 12. In some embodiments, a portion of the first dielectric layer 131 has a profile conformal to the recessed portions R11 of the top surface F11 of the substrate 11. In some embodiments, the first dielectric layer 131 is formed in the recessed portions R11 of the top surface F11 of the substrate 11. In some embodiments, a thickness of the first dielectric layer 131 is in a range of 5 to 8 nanometers.

Figure 6:
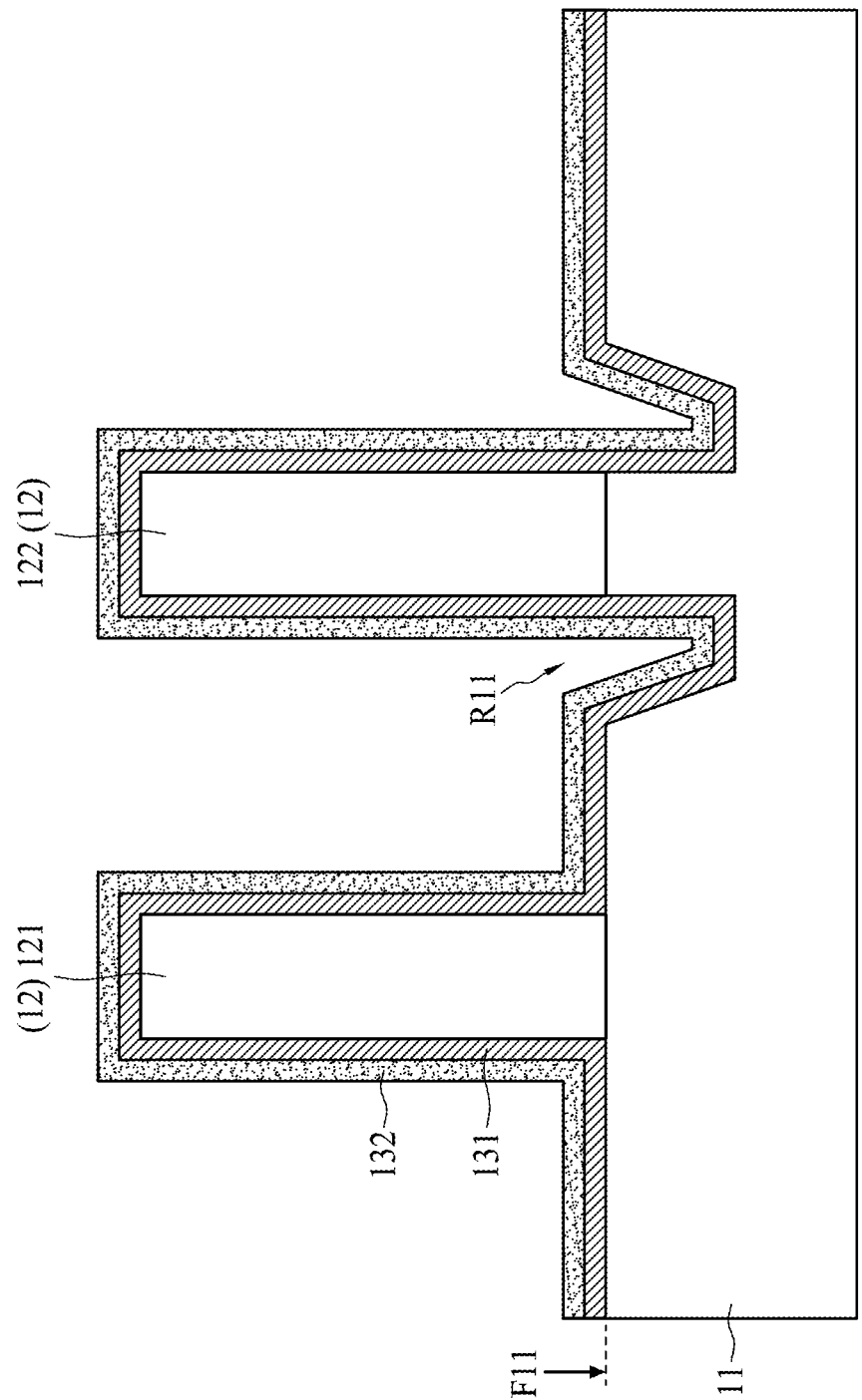

Referring to FIG. 6, a sacrificial layer 132 is formed on the front side S11 of the substrate 11. In some embodiments, the sacrificial layer 132 is formed over and conformal to the first dielectric layer 131. The sacrificial layer 132 has a profile conformal to the profile of the bit line structures 12 and the substrate 11, and also conformal to the profile of the first dielectric layer 131. The sacrificial layer 132 is formed on the lateral sidewalls and covering the tops of the bit line structures 12. In some embodiments, a portion of the sacrificial layer 132 has a profile conformal to the recessed portions R11 of the top surface F11 of the substrate 11. In some embodiments, the sacrificial layer 132 is formed in the recessed portions R11 of the top surface F11 of the substrate 11. In some embodiments, a thickness of the sacrificial layer 132 is in a range of 2 to 5 nanometers.

Figure 7:
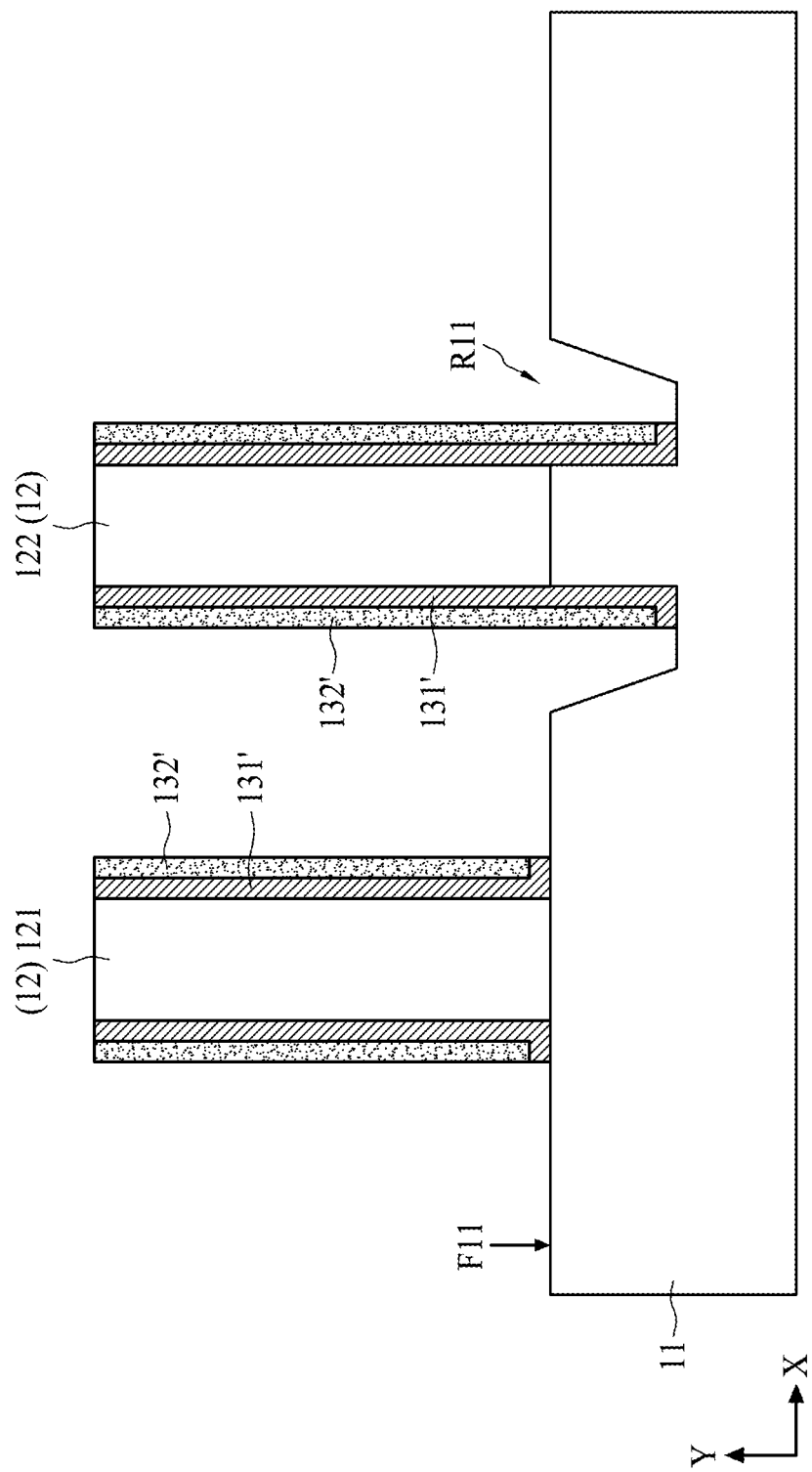

Referring to FIG. 7, a portion of the sacrificial layer 132 is removed to form a sacrificial layer 132', and a portion of the first dielectric layer 131 is removed to form a first dielectric layer 131'. In some embodiments, only vertical portions (portions extending along the Y direction) of the sacrificial layer 132 are left remaining, and only the portions of the first dielectric layer 131 covered by the sacrificial layer 132' are left remaining. In some embodiments, the first dielectric layer 131' is disposed only on the lateral sidewalls (i.e., vertical sidewalls extending substantially along the Y direction) of the bit line structures 12. Similarly, the sacrificial layer 132' is also disposed only on the lateral sidewalls (i.e., vertical sidewalls extending substantially along the Y direction) of the bit line structures 12 on the first dielectric layer 131'.

In some embodiments, a first directional etching operation is performed to remove horizontal portions (extending along the X direction) of the sacrificial layer 132. Next, a second directional etching operation is performed to remove portions of the first dielectric layer 131 exposed through the remaining sacrificial layer 132'. Methods of formations of the sacrificial layer 132' and the first dielectric layer 131' are not limited herein. Any suitable technologies can be used, such as reactive ion etching (RIE), a lithographic operation, chemical mechanical polishing (CMP), other suitable operations, or a combination thereof, to form the structure shown in FIG. 7. In some embodiments, material of the sacrificial layer 132 is different from that of the first dielectric layer 131.

Portions of the first dielectric layer 131 and the sacrificial layer 132 on the tops of the bit line structures 12 are removed, thereby exposing the bit line structures 12. In some embodiments, portions of the first dielectric layer 131 and the sacrificial layer 132 on the tilt surface F111 and the planar surface F112 in the recessed portion R11 are also removed. It should be noted that the first dielectric layer 131' physically contacts the top surface F11 outside the recessed portions R11, and the bottom surface F112 of the recessed portions R11 of the top surface F11, due to the coverage of the sacrificial layer 131'.

Figure 8:
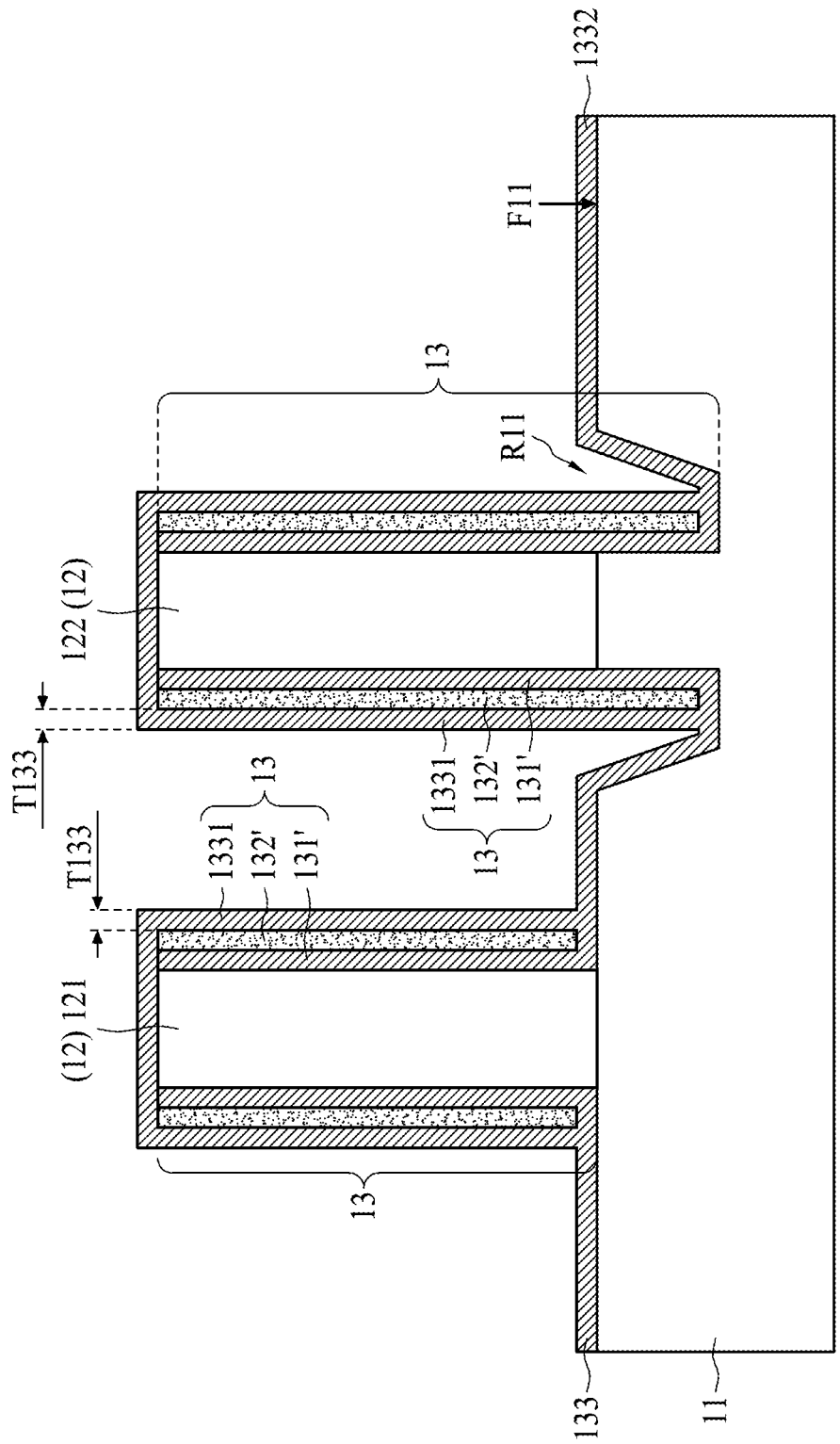

Referring to FIG. 8, a second dielectric layer 133 is formed on the front side S11 of the substrate 11. In some embodiments, the second dielectric layer 133 is formed over and conformal to the substrate 11, the bit line structures 12, the first dielectric layer 131', and the sacrificial layer 132'. In some embodiments, the second dielectric layer 133 contacts the exposed portions (i.e., the tops) of the bit line structures 12. In some embodiments, the second dielectric layer 133 contacts the top surface F11 of the substrate 11, which includes the tilt surface F111 and the bottom surface F112 of the recessed portions R11. In some embodiments, a thickness T133 of the second dielectric layer 133 is in a range of 5 to 8 nanometers. The second dielectric layer 133 includes two portions: a spacer portion 1331 and non-spacer portion 1332, which is the portion of the second dielectric layer 133 other than the spacer portion 1331. The spacer portion 1331 is the portion of the second dielectric layer 133 that is overlapped by or contacts the sacrificial layer 13T and the first dielectric layer 131'. The spacer portion 1331 substantially overlaps all of the sidewalls of the bit line structures 12.

A spacer structure 13 including the first dielectric layer 131', the sacrificial layer 132', and the spacer portion 1331 of the second dielectric layer 133 is formed. The spacer structure 13 is disposed on the lateral sidewalls of the bit line structures 12.

Material of the first dielectric layer 131 is different from that of the sacrificial layer 132, and material of the second dielectric layer 133 is different from that of the sacrificial 132. In some embodiments, the materials of the first dielectric layer 131 and the second dielectric layer 133 are different. In some embodiments, the materials of the first dielectric layer 131 and the second dielectric layer 133 are the same. In some embodiments, the first dielectric layer 131 is nitride (e.g., silicon nitride), the sacrificial layer 132 is oxide (e.g., silicon oxide), and the second dielectric layer 133 is nitride (e.g., silicon nitride). In some embodiments, the first dielectric layer 131 is oxide (e.g., silicon oxide), the sacrificial layer 132 is nitride (e.g., silicon nitride), and the second dielectric layer 133 is oxide (e.g., silicon oxide).

Prior to formation of a gap between the first dielectric layer 131' and the spacer portion 1331 of the second dielectric layer 133 in accordance with the operation O104 of the method M10, multiple operations, such as depositions, contact formations, landing pad formations and cleaning operations, may be performed.

Figure 9:
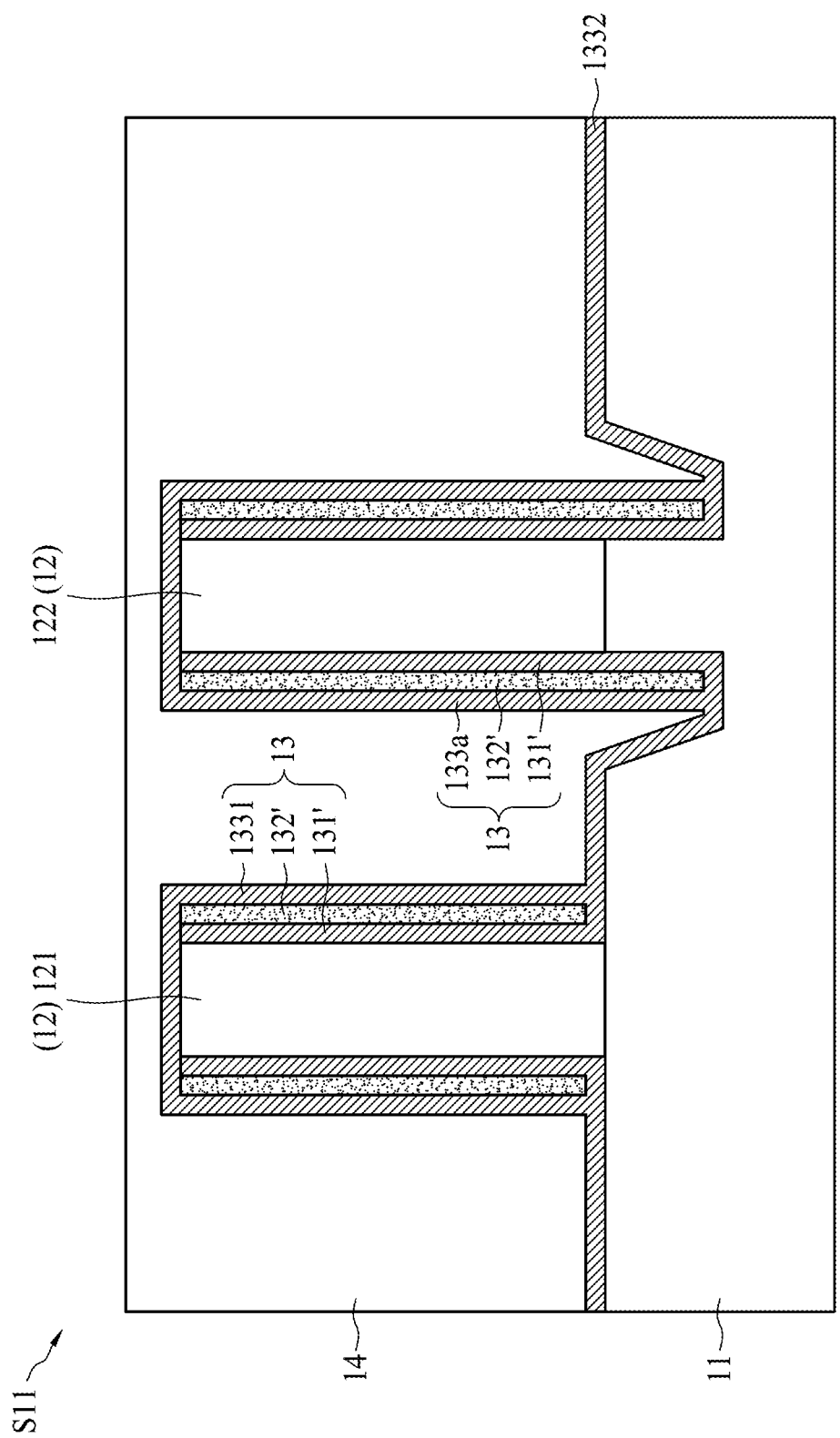
Figure 10:
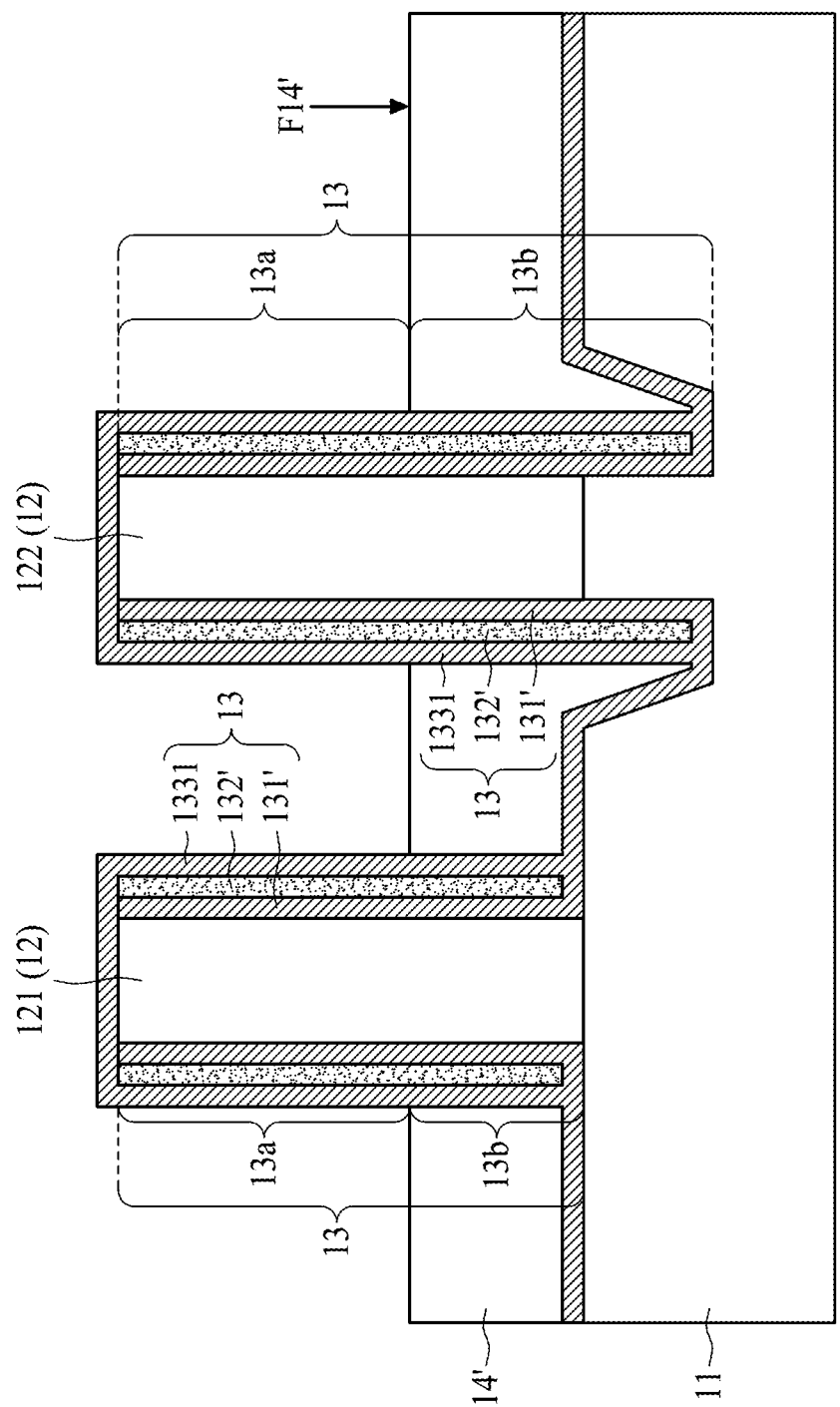

Referring to FIGS. 9 to 10, a polysilicon layer 14 is deposited over the front side S11 of the substrate 11, covering the top surface F11 of the substrate 11, the bit line structures 12 and the spacer structure 13. An etching operation is subsequently performed to remove a portion of the polysilicon layer 14 to form a polysilicon layer 14'. The tops of the bit line structures 12 are exposed through the polysilicon layer 14', and portions of the bit line structures 12 away from the substrate 11 are revealed. Similarly, portions of the spacer structure 13 are also exposed through the polysilicon layer 14' and the other portions of the spacer structure 13 are covered by the polysilicon layer 14'. In other words, using a top surface F14' of the polysilicon layer 14' as a reference surface, a first portion 13a of the spacer structure 13 away from the substrate 11 and protruding from the top surface F14' is exposed to the subsequent processing; and a second portion 13b of the spacer structures 13 below and concealed by the top surface F14' is protected by the polysilicon layer 14' from the subsequent processing.

Figure 11:
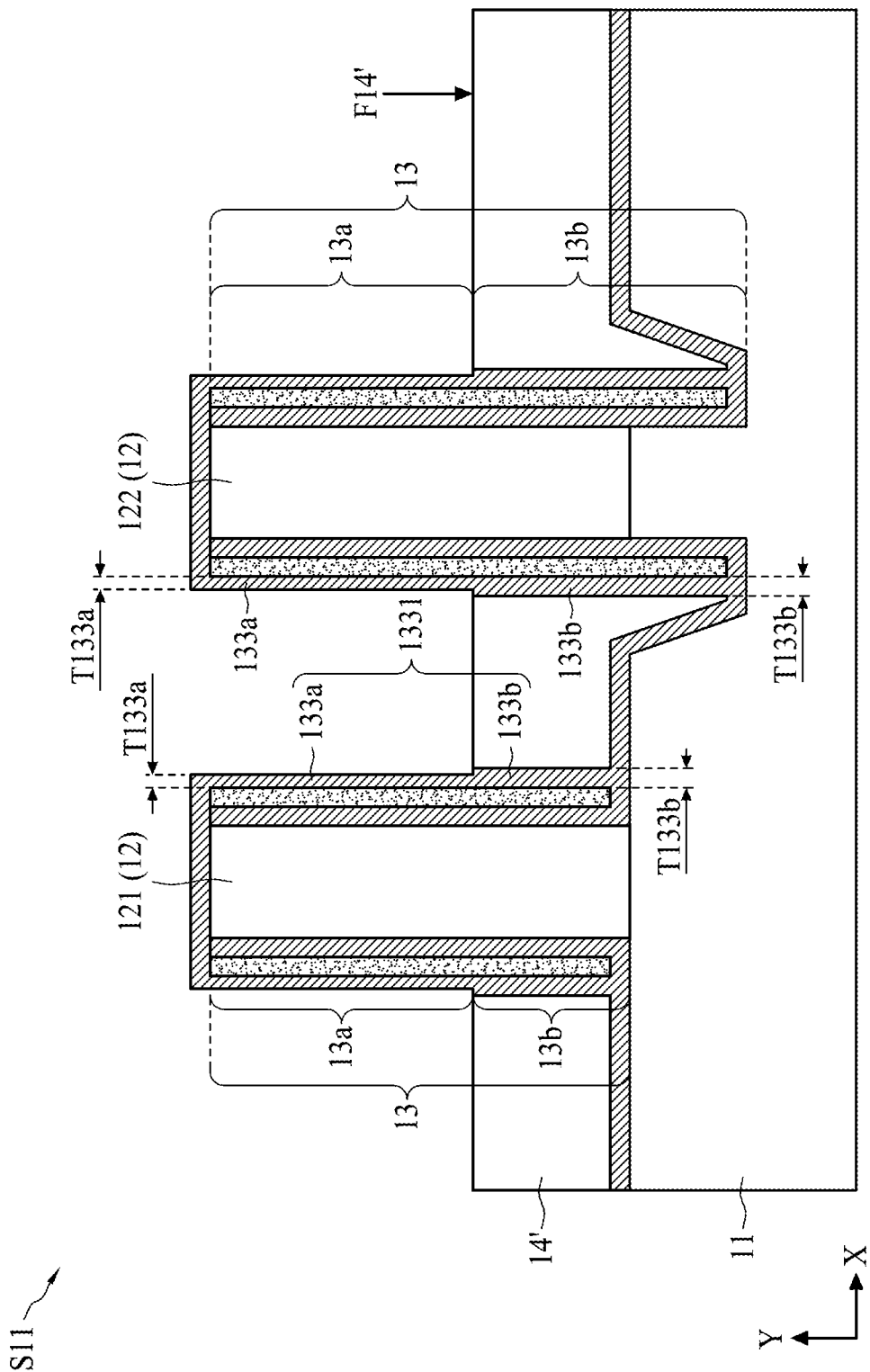

Referring to FIG. 11, a pre-metal cleaning operation is performed on the front side S11 of the substrate 11. The pre-metal cleaning is performed on the top surface F14' of the polysilicon layer 14' and portions of the spacer portion 1331 of the second dielectric layer 133 in the first portion 13a of the spacer structure 13. The portions of the spacer portion 1331 exposed to the pre-metal cleaning operation are consumed. As shown in FIG. 11, a thickness of the portions of the spacer portion 1331 of the second dielectric layer 133 on the lateral sidewalls of the bit line structures 12 (i.e., vertical portions of the second dielectric layer 133 exposed through the polysilicon layer 14') is reduced. The portions of the spacer portion 1331 having a reduced thickness T133a are referred to as a consumed portion 133a of the second dielectric layer 133. The portions of the spacer portion 1331 covered by the polysilicon layer 14' having a thickness T133b, which is equal to the thickness T133 of the second dielectric layer 133, is referred to as a protected portion 133b of the second dielectric layer 133.

In some embodiments, the thickness T133a of the consumed portion 133a is reduced from the thickness T133 of the second dielectric layer 133 by 1 to 2 nanometers. In some embodiments, the thickness T133b of the protected portion 133b is greater than the thickness T133a of the consumed portion 133a by 1 to 2 nanometers. In some embodiments, the spacer portion 1331 has a stepped configuration, wherein a width (i.e. the thickness T133a) of the spacer portion 1331 above the top surface F14' of the polysilicon layer 14' is less than a width (i.e. the thickness T133b) of the spacer portion 1331 below the top surface F14' of the polysilicon layer 14'. Other portions of the second dielectric layer 133 exposed through the polysilicon layer 14' (e.g., horizontal portions on the tops of the bit line structures 12) can also be consumed (not shown in the figures) during the pre-metal cleaning operation.

Figure 12:
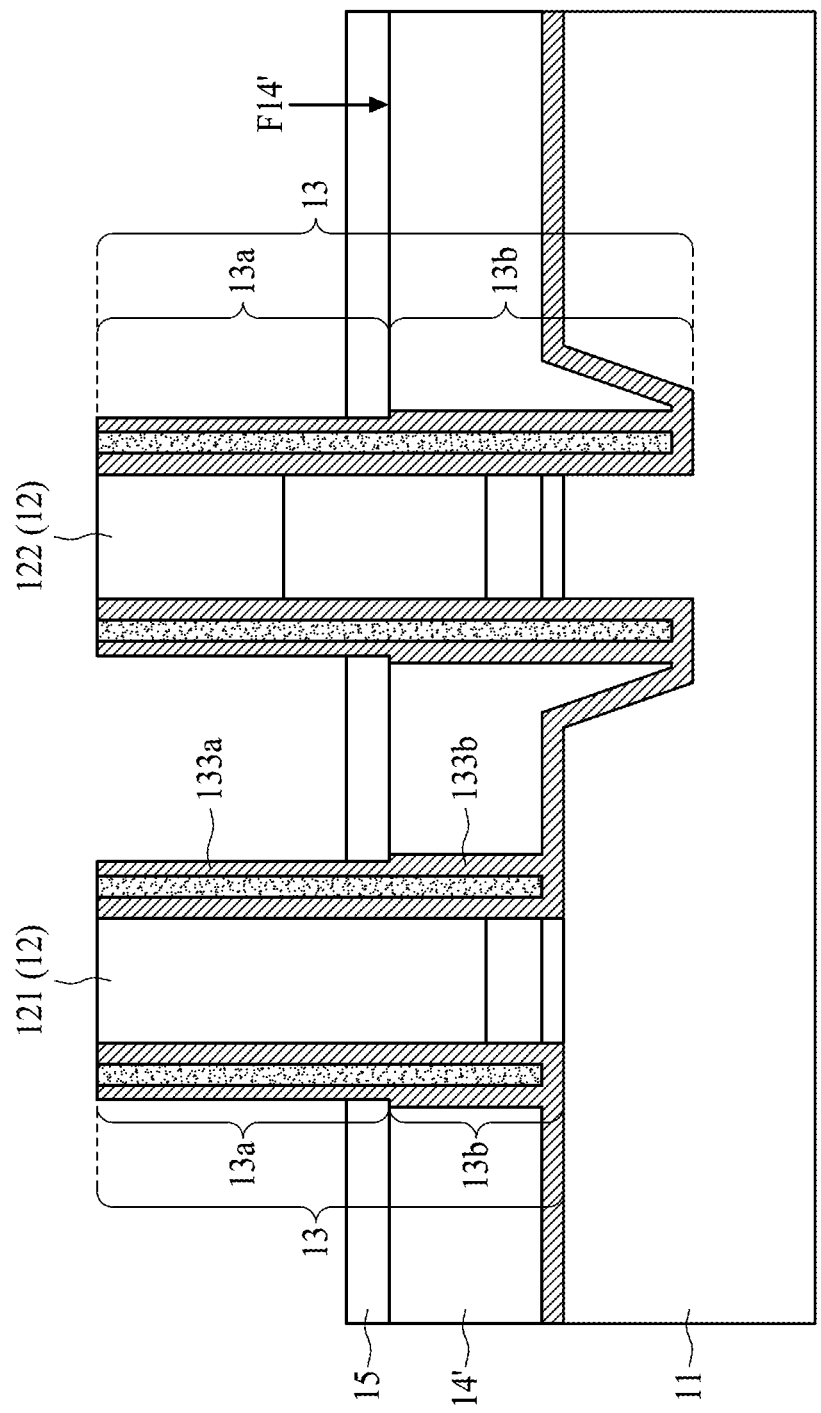

Referring to FIG. 12, a metal deposition is performed to form a pure metal layer 15 over the polysilicon layer 14' and adjacent to the bit line structures. In some embodiments, the pure metal layer 15 includes at least one of cobalt and titanium. Other suitable materials can be used in other embodiments, and the material is not limited herein. The pure metal layer 15 can be formed by a suitable deposition operation to cover the entire second dielectric layer 133 and the polysilicon layer 14', and a metal etch operation is then performed to reveal portions of the bit line structures 12 and some of the first portion 13a of the spacer structure 13. In some embodiments, portions of the second dielectric layer 133 on the tops of the bit line structures 12 are removed concurrently in the metal etch operation. Conventional techniques can be applied, and the technique is not limited herein.

A post-metal cleaning operation is optionally performed after formation of the pure metal layer 15. In some embodiments, the first portion 133a of the spacer portion 1331 of the second dielectric layer 133 exposed through (or above) the pure metal layer 15 can be further consumed (not shown in the figures), and a thickness of the spacer portion 1331 where the first portion 133a is exposed through the pure metal layer 15 can be further reduced. Other cleaning operations or sub-operations can be optionally applied, and are not limited herein. In some embodiments, a total consumption of the thickness of the spacer portion 1331 prior to formation of a adhesion layer 16, which is sequentially performed after the post-metal cleaning operation, is about 1 to 2 nanometer.

Figure 13:
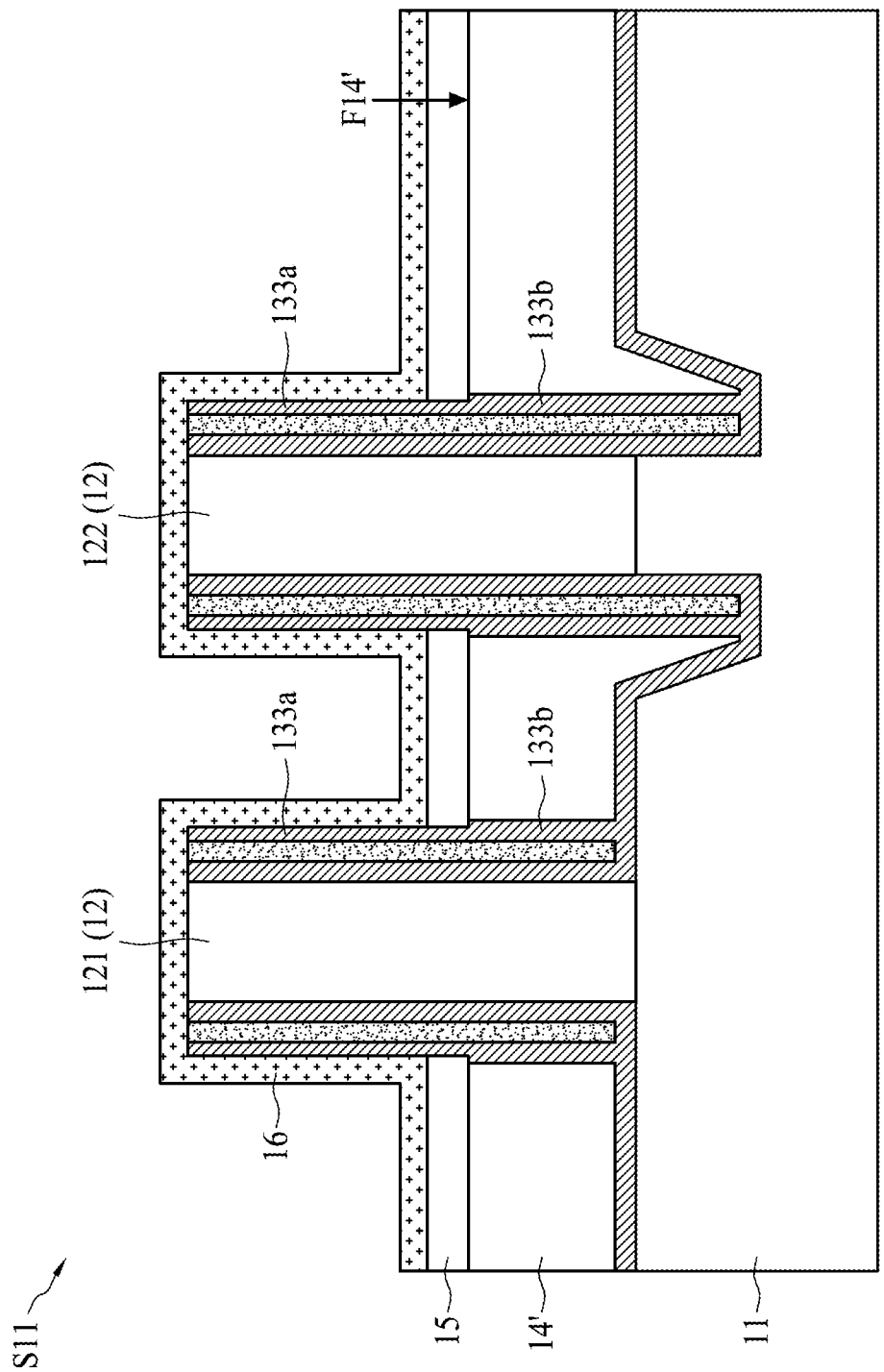

Referring to FIG. 13, a adhesion layer 16 is formed over the substrate 11 and covering the bit line structures 12. The adhesion layer 16 is conformal to the exposed portion of the second dielectric layer 133 and the pure metal layer 15. In some embodiments, the adhesion layer 16 includes titanium nitride (TiN), tantalum nitride (TaN), or a combination thereof. In some embodiments, the adhesion layer 16 is formed by conformal deposition, chemical vapor deposition (CVD), physical vapor deposition (PVD) or any other suitable operation. In some embodiments, the adhesion layer 16 is for a purpose of increase adhesion between landing pads 1T (to be formed later in the process) and the bit line structures 12 to prevent peeling off of the landing pads 17'.

Figure 14:
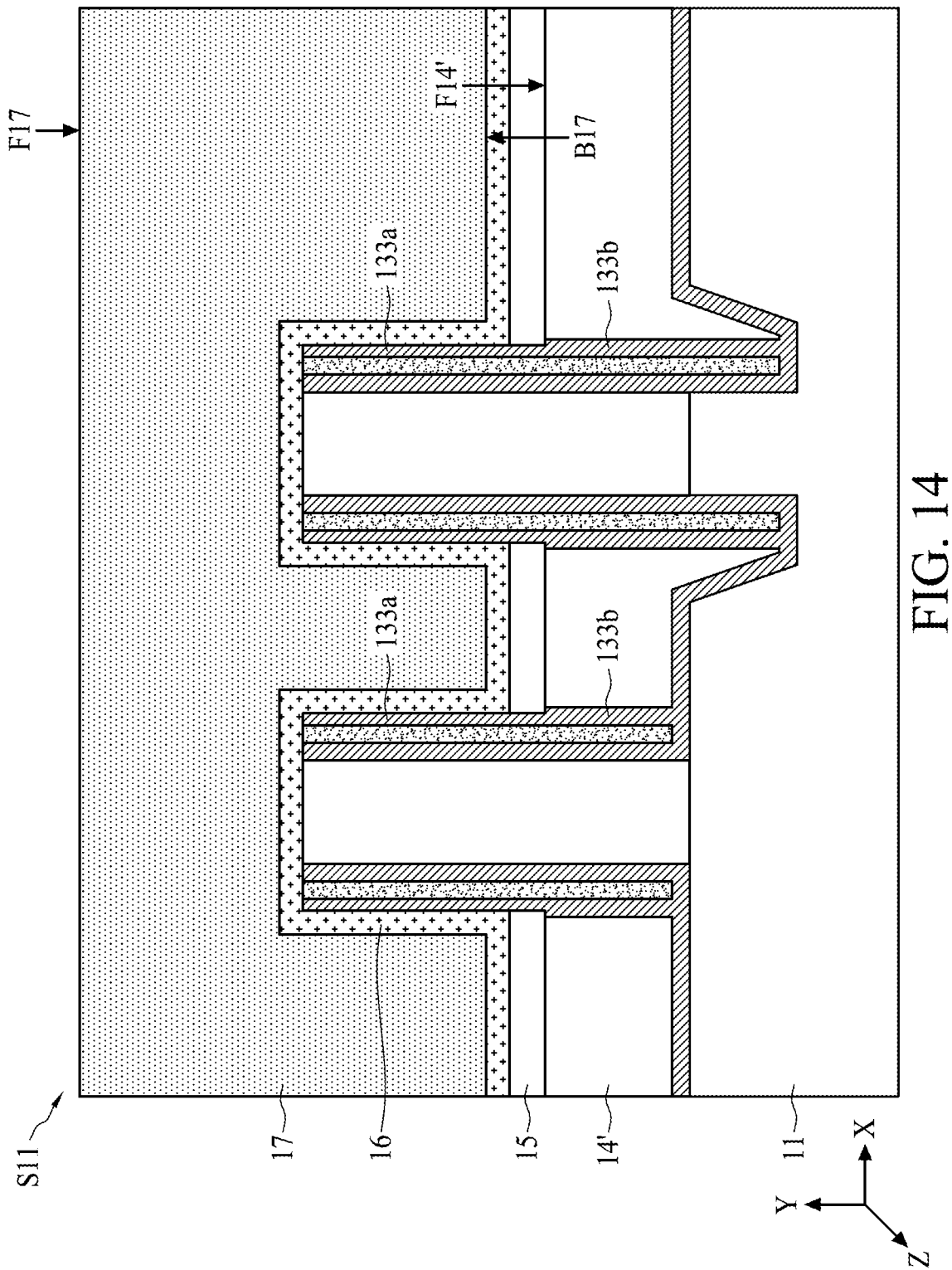

Referring to FIG. 14, a landing layer 17 is deposited over the front side S11 of the substrate 11 covering the bit line structures 12 and the spacer structures 13. The landing layer 17 has a top surface F17 and a bottom surface B17 opposite to the top surface F17, wherein the bottom surface B17 contacts the adhesion layer 16 over the substrate 11. In some embodiments, the top surface F17 is substantially planar along the X-Z plane; and the bottom surface B17 is conformal to a profile of the adhesion layer 16.

Figure 15:
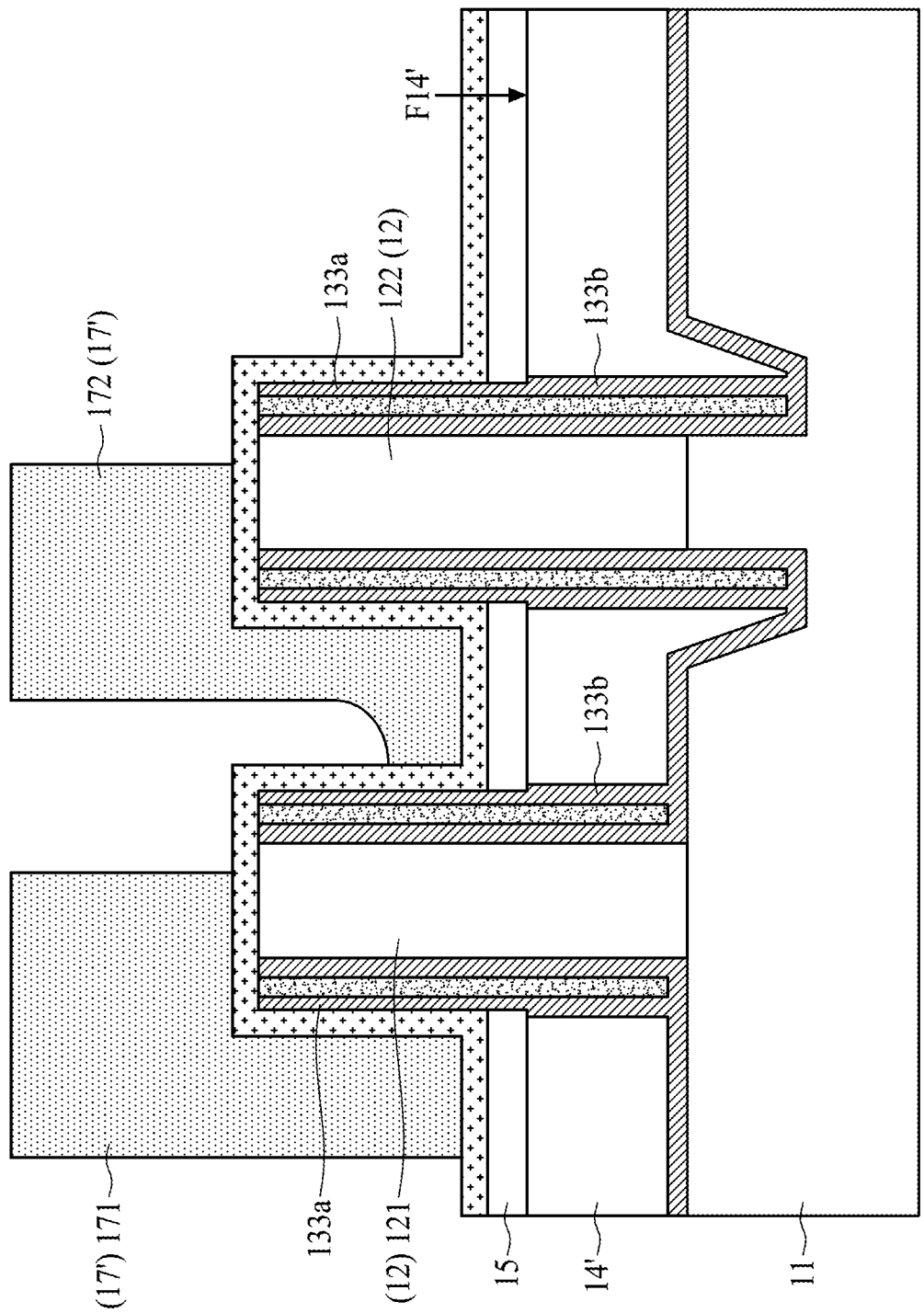

Referring, to FIG. 15, a portion of the landing layer 17 is removed to form a plurality of landing pads 17'. Each of the landing pads 17' has a bottom surface B17' contacting a portion of the adhesion layer 16 that is over a portion of the bit line structure 12 and a portion of the spacer structure 13. In some embodiments, the portion of the landing layer 17 is removed by an etching operation. At least a portion of the top of each of the bit line structures 12 and a portion of the spacer structure 13 along a side of each of the bit line structures 12 are not covered by (or not overlapped by) the landing pads 17' from the cross-sectional view, as shown in FIG. 15.

In some embodiments, the landing pads 17' include a first landing pad 171 and a second landing pad 172. Due to a small distance interval between adjacent bit line structures 12 (e.g., the bit line structure 121 and the bit line structure 122, as shown in FIG. 15), and due to a low removal rate at the latter part of the etching operation, a portion of some landing pads 17 (e.g., the landing pad 172 shown in FIG. 15) proximal to the bottom surface B17' contacts a portion of the adhesion layer 16 that is attached to the vertical portion of the spacer structure 13 on the sidewall of the adjacent bit line structure 12 (e.g., the bit line structure 121). As shown in FIG. 15, the landing pad 172 has a curved sidewall curving toward the adjacent bit line structure 121. Some of the landing pads 17 (e.g., the landing pad 171 shown in FIG. 15) have substantially vertical sidewalls without a curved sidewall.

Figure 16:
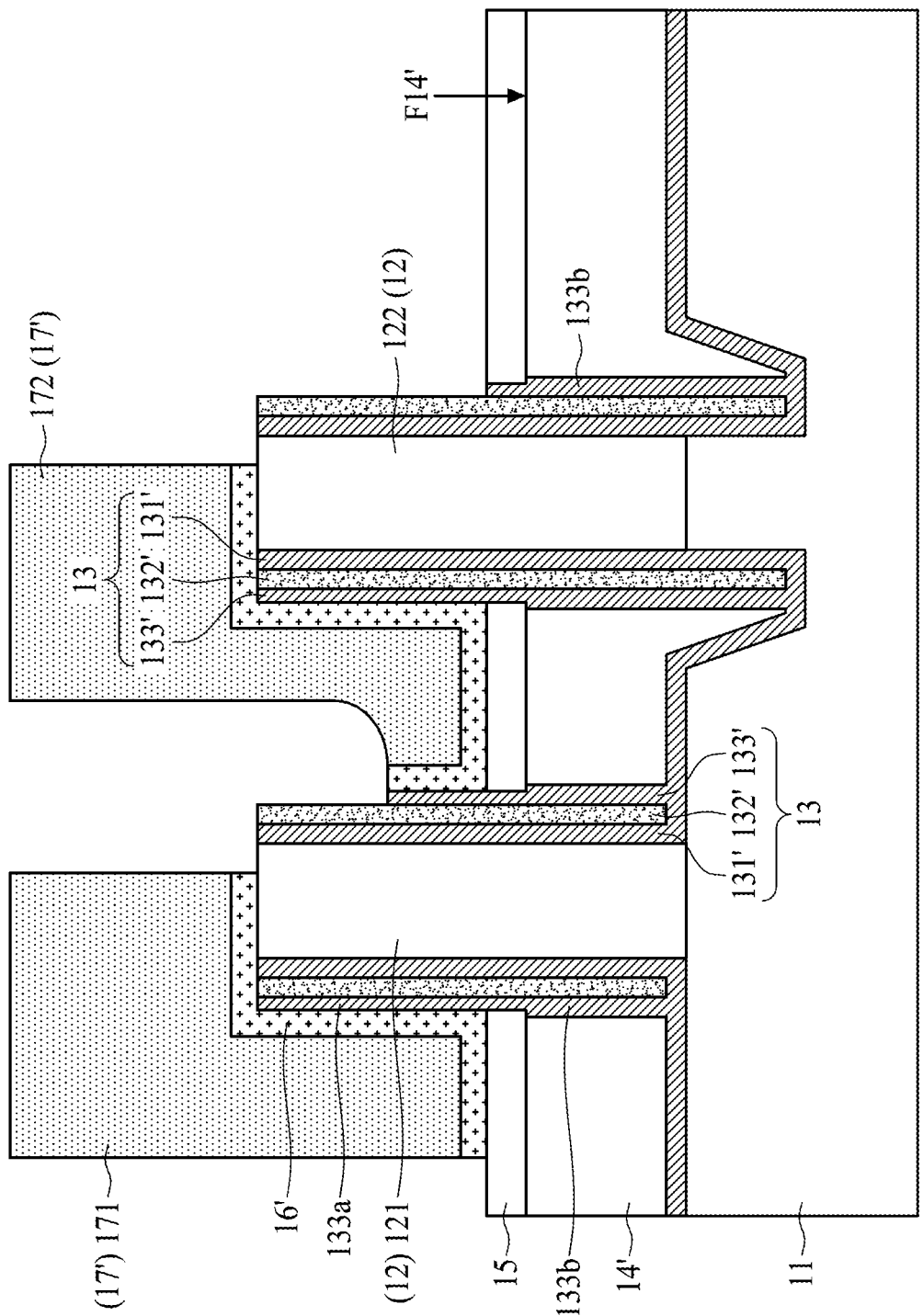

Referring to FIG. 16, a portion of the adhesion layer 16 exposed through the landing pads 17 is removed to form a adhesion layer 16', and a portion of the spacer structure 13 is exposed. In addition, a portion of the second dielectric layer 133 on the line structures 12 exposed through the landing pads 17 is removed. Specifically, a portion of the first portion 133a of the spacer portion 1331 exposed through the landing pads 17 is removed to form a spacer portion 133' from the spacer portion 1331 (the spacer portion 133' of the second dielectric layer 133 is hereafter abbreviated as the spacer dielectric layer 133'). In some embodiments, the portion of the adhesion layer 16 exposed through the landing pads 17, and the portions of the second dielectric layer 133 exposed through the adhesion layer 16' are removed by multiple etching operations. In some embodiments, the portion of the adhesion layer 16 and the portions of the second dielectric layer 133 exposed through the landing pads 17 are removed concurrently by one etching operation. At least a portion of the sacrificial layer 132' over each of the bit line structures 12 is exposed. In some embodiments, the adhesion layer 16' is formed concurrently with the formation of the landing pads 17' as shown in FIG. 15. In other words, the portion of the adhesion layer 16 is removed by the etching operation of forming the landing pads 17'.

Figure 17:
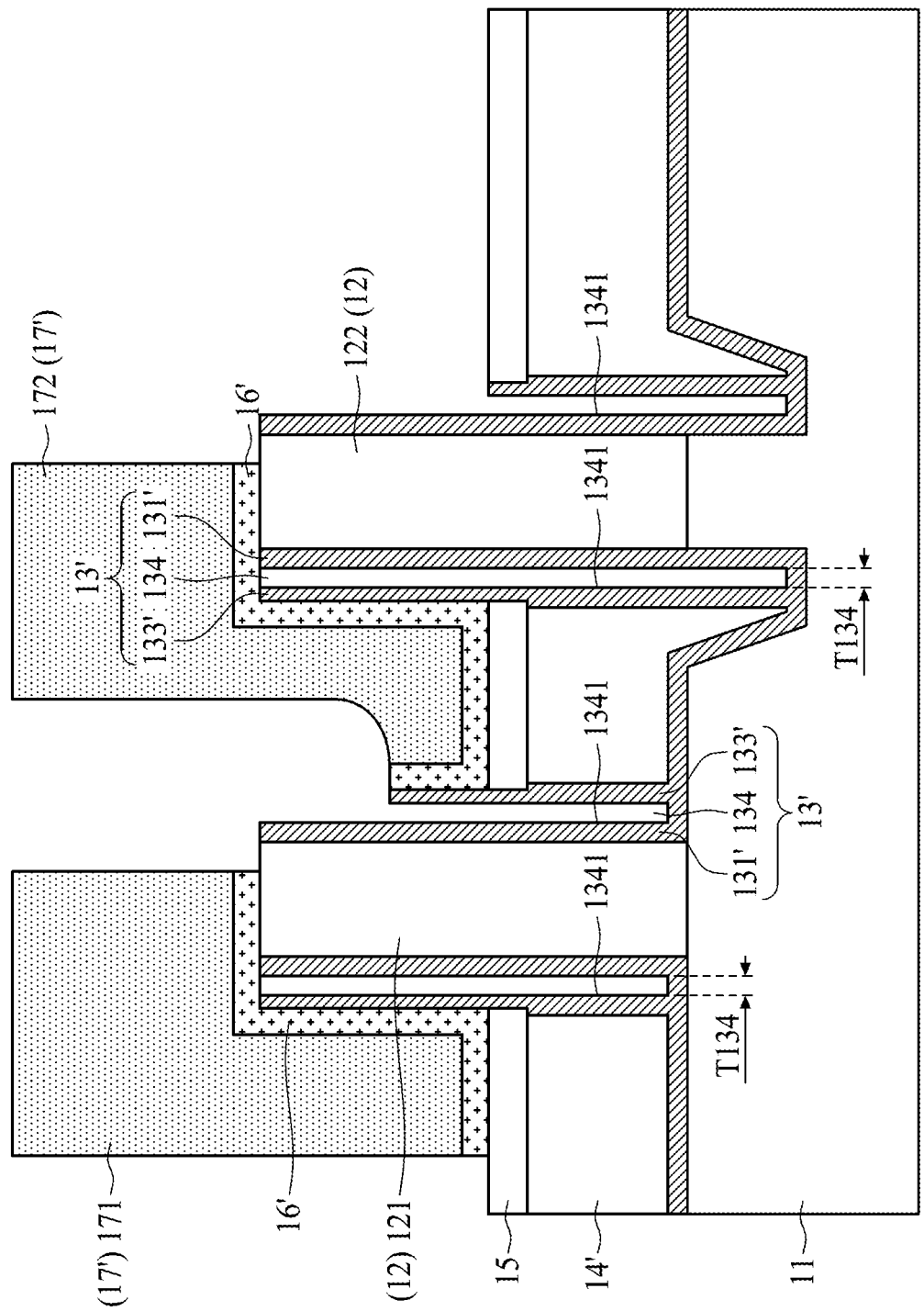

Referring to FIG. 17, in accordance with the operation O104 of the method M10, the sacrificial layer 132' of the spacer structures 13 is removed, thereby forming a first gap 134 between the first dielectric layer 131' and the spacer dielectric layer 133'. In some embodiments, the sacrificial layer 132' is removed by a vapor etching operation. In some embodiments, vapor-phase hydrogen fluoride (HF) is used to remove the sacrificial layer 132'. As each of the landing pads 17 covers only a portion of the corresponding bit line structure 12, some portions of the sacrificial layer 132' that are covered by the landing pad 17 physically connect to other portions of the sacrificial layer 132' exposed through the landing pads 17, and thus the entire sacrificial layer 132' is removed by the vapor HF. The first gap 134 is defined by the first dielectric layer 131' and the spacer dielectric layer 133'. In some embodiments, a portion of the first dielectric layer 131' and a portion of the spacer portion 1331 adjacent to the sacrificial layer 132' are consumed by the vapor etching operation. In some embodiments, a thickness of the first dielectric layer 131' and a thickness of the spacer dielectric layer 133' are reduced respectively by 1 to 2 nanometers. In some embodiments, the first gap 134 has a width T134 in a range of 5 to 8 nanometers, which is equal to a distance between a vertical portion of the first dielectric layer 131' and the spacer dielectric layer 133' of the spacer structure 13. In some embodiments, the width T134 of the first gap 134 is substantially equal to the thickness of the sacrificial layer 132 (which is equal to the thickness of the sacrificial layer 132'). In some embodiments, some of the first dielectric layer 131' and some of the second dielectric layer 133' are consumed at points of contact with the sacrificial layer 132' during the vapor etching operation, and thus the width T134 of the first gap 134 is greater than the thickness of the sacrificial layer 132 or the thickness of the sacrificial layer 132'.

For ease of understanding, the interface of the first gap 134 and the first dielectric layer 131' and the interface of the first gap 134 and the spacer dielectric layer 133' are referred to as inner sidewalls 1341.

Figure 18:
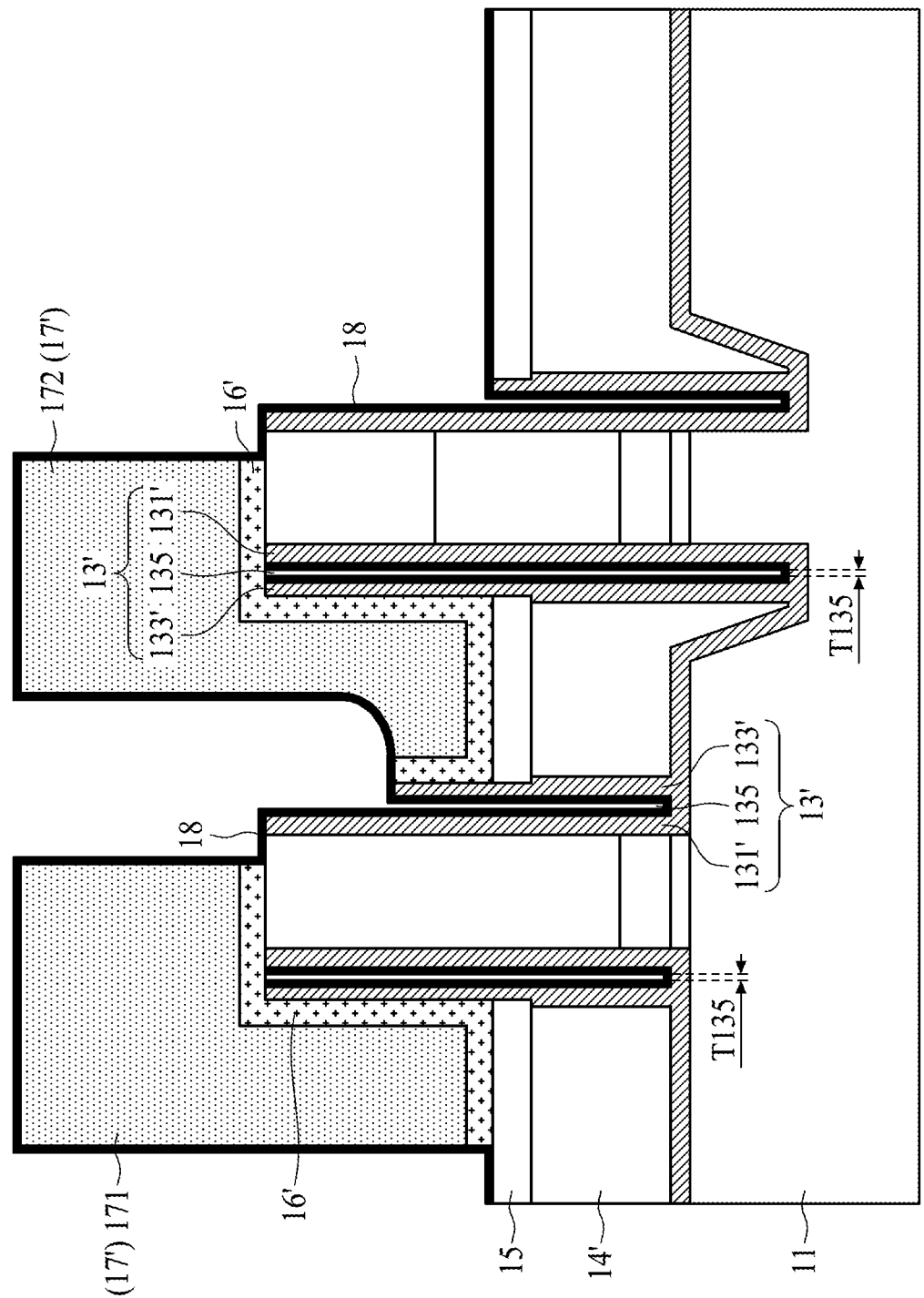

Referring to FIG. 18, in accordance with the operation O105, a spacer layer 18 is formed along the inner sidewall 1341, and the width T134 of the first gap 134 is reduced. In some embodiments, the spacer layer 18 is formed by atomic layer deposition on and along the inner sidewall 1341. The spacer layer 18 is made of dielectric materials. In some embodiments, the spacer layer 18 includes nitride, oxide, oxynitride, or any combination thereof. In some embodiments, the spacer layer 18 is made of the same material as the first dielectric layer 131 and/or the second dielectric layer 133. In some embodiments, there is no distinct interface between the spacer layer 18 and the first dielectric 131' if the spacer layer 18 and the first dielectric 131' are made of the same material. In some embodiments, there is no distinct interface between the spacer layer 18 and the spacer dielectric layer 133' if the spacer layer 18 and the spacer dielectric layer 133' are made of the same material. In some embodiments, a thickness of the spacer layer 18 is in a range of 0.5 to 2 nanometers. In some embodiments, the width T135 is less than the width T134 by 1 to 4 nanometers.

Figure 20:
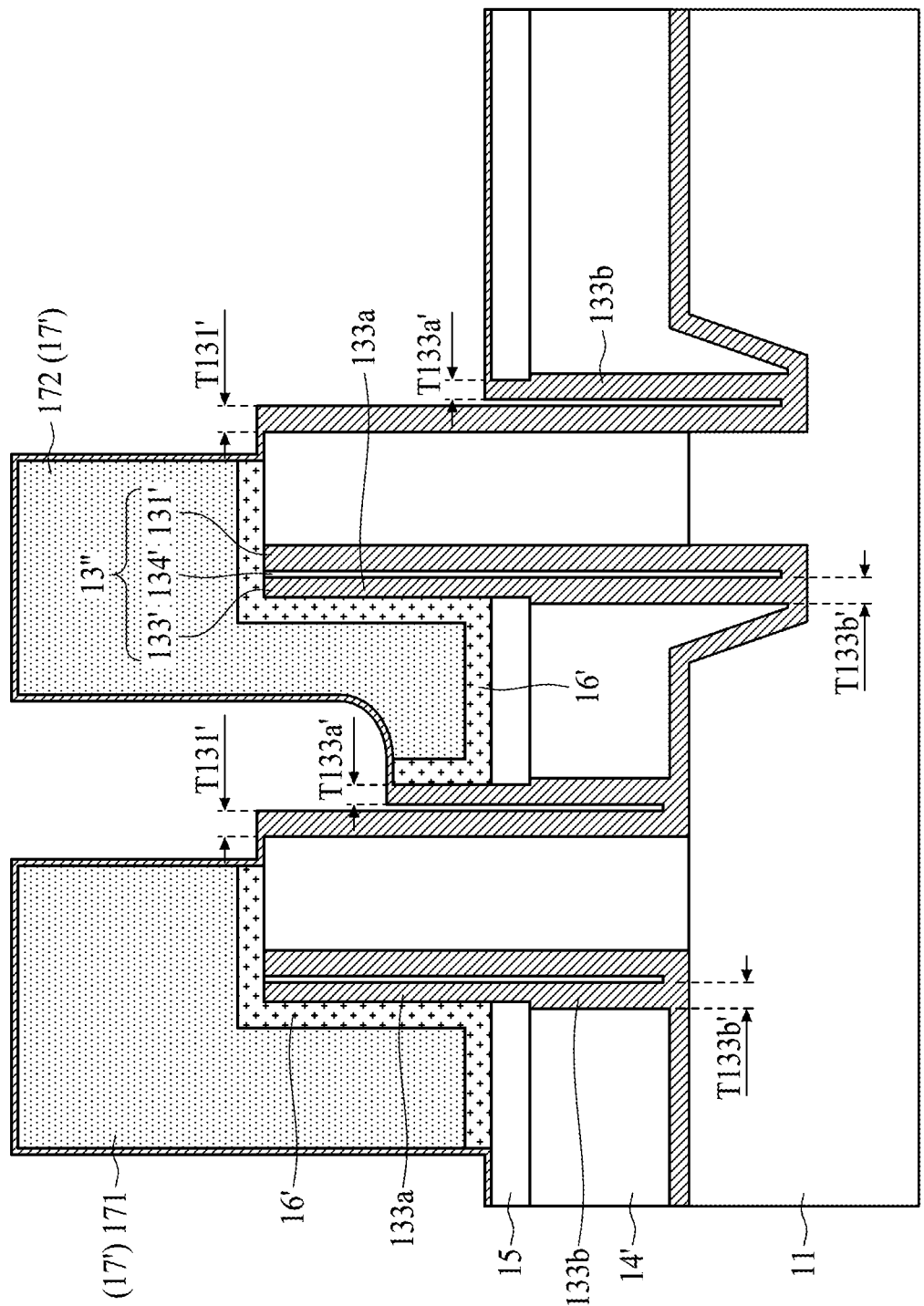
FIG. 20 is a cross-sectional view of an intermediate semiconductor structure in accordance with some embodiments of the present disclosure.

The spacer layer 18 shown in FIG. 18 is for illustration, but it is not intended to limit the spacer layer 18 of the present disclosure from being made of materials different from those of the first dielectric layer 131' and the second dielectric layer 133'. Referring to FIG. 20, in accordance with some embodiments, the first dielectric layer 131', the spacer dielectric layer 133', and the spacer layer 18 are made of the same nitride materials. Thus, there are no distinct interfaces between the spacer layer 18 and the first dielectric layer 131', or between the spacer layer 18 and the spacer dielectric layer 133'. The spacer layer 18 is considered as being a part of the first dielectric layer 131' and a part of the spacer dielectric layer 133'. In some embodiments, a thickness T133a' of the consumed portion 133a is greater than the thickness T133a by 0.5 to 2 nanometers. In some embodiments, a thickness T133b' of the protected portion 133b is greater than the thickness T133b by 0.5 to 2 nanometers. In some embodiments, a thickness T131' of the first dielectric layer 131' is also greater than the thickness of the first dielectric layer 131 by 0.5 to 2 nanometers. However, a difference in thickness between the protected portion 133b and the consumed portion 133a remains the same.

In some embodiments, the operation O105 can be considered to increase the thickness of the first dielectric layer 131' and the thickness of the spacer dielectric layer 133'.

After formation of the spacer layer 18, a second gap 135 is formed. The second gap 135 is formed from the first gap 134 and has a width T135 controlled in a range of 3 to 5 nanometers. A combination of the first dielectric layer 131', the spacer layer 18, the second gap 135 and the spacer dielectric layer 133' is referred to as a spacer structure 13'. It should be noted that the spacer layer 18 is formed with a thickness that depends on the width T135 of the second gap 135.

Figure 19:
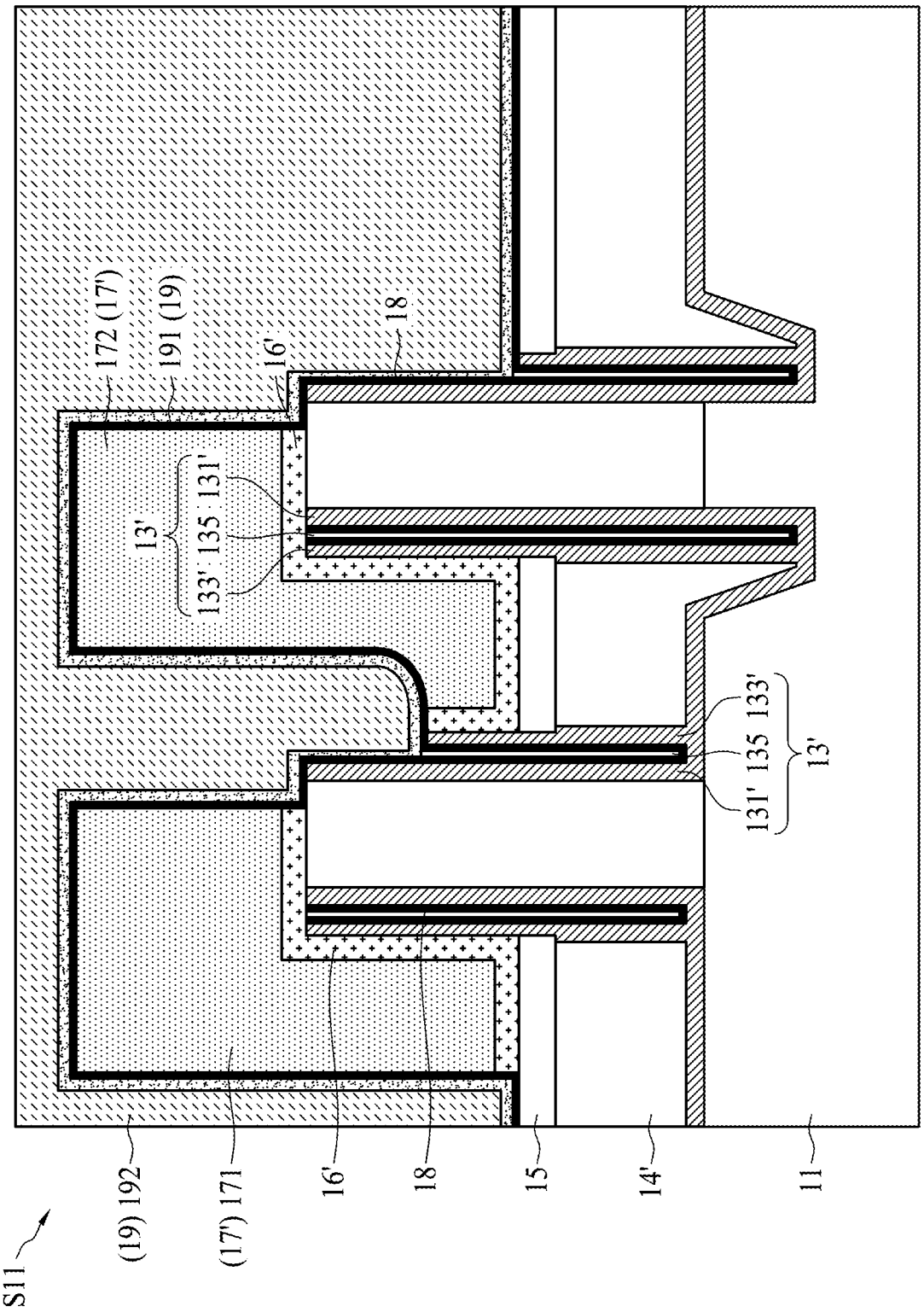

Referring to FIG. 19, in accordance with the operation O106 of the method M10, a seal layer 19 is formed over the front side S11 of the substrate 11. In some embodiments, the seal layer 19 is a multi-layered structure. In some embodiments, the seal layer 19 includes a linear layer 191 and a planar layer 192. In some embodiments, the linear layer 191 is conformal to a profile of the bit line structures 12 and the landing pads 17'. In some embodiments, the linear layer 191 is formed by a chemical vapor deposition (CVD), which seals the second gap 135 over the bit line structures 12 without filling in the second gap 135. In some embodiments, the linear layer 191 is formed with a high deposition rate so that to have a less condensed structure and prevent filling in the second gap 135. In some embodiments, the planar layer 192 is formed by an atomic layer deposition (ALD) to avoid formation of voids and covers the entire front side S11 of the substrate 11.

It should be noted that every cleaning operation performed on the exposed portions of the second dielectric layer 133 raises a possibility of the exposed portions of the second dielectric layer 133 being consumed. However, the loss of the second dielectric layer 133 on the spacer portion 1331 of the spacer structure 13 can alter the electrical properties of the device. The spacer layer 18 of the present disclosure can compensate for the loss of the second dielectric layer 133 in the spacer structure 13.

Therefore, with the above-mentioned method and configurations thereof, a spacer structure having an air gap between the two dielectric layers can be formed, and thicknesses of the dielectric layers can be maintained, and thus lost or missing portions of dielectric layers on the spacer structure can be prevented.

One aspect of the present disclosure provides a semiconductor structure. The semiconductor structure includes: a polysilicon layer, having a first surface and a second surface opposite to the first surface; a substrate, disposed on the second surface of the polysilicon layer; a bit line structure, disposed on the substrate, penetrating through the polysilicon layer and protruding from the first surface of the polysilicon layer; and a spacer structure, disposed on lateral sidewalls of the bit line structure, including an air gap sandwiched by a first dielectric layer and a second dielectric layer, wherein a first portion of the second dielectric layer is in the polysilicon layer, a second portion of the second dielectric layer is outside the polysilicon layer, and a thickness of the second portion of the second dielectric layer is less than a thickness of the first portion of the second dielectric layer.

Another aspect of the present disclosure provides a method for manufacturing a semiconductor structure. The method includes: receiving a substrate; forming a bit line structure on a top surface of the substrate; forming a spacer structure on the bit line structure, the spacer structure including a sacrificial layer sandwiched by a first dielectric layer and a second dielectric layer; removing the sacrificial layer to form a gap between the first dielectric layer and the second dielectric layer; reducing a width of the gap; and forming a seal layer to seal the gap.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
a polysilicon layer, having a first surface and a second surface opposite to the first surface;
a substrate; disposed on the second surface of the polysilicon layer;
a bit line structure, disposed on the substrate, penetrating through the poly silicon layer from the second surface to the first surface and protruding from the first surface of the polysilicon layer; and
a spacer structure, disposed on lateral sidewalls of the bit line structure, including an air gap sandwiched by a first dielectric layer formed on the lateral sidewalls of the bit line structure and a second dielectric layer, wherein a first portion of the second dielectric layer is contacted with and located in the polysilicon layer, a second portion of the second dielectric layer is outside the polysilicon layer and in no contact with the polysilicon layer, and a thickness of the second portion of the second dielectric layer is less than a thickness of the first portion of the second dielectric layer.

2. The semiconductor structure of claim 1, further comprising:
a metal layer, disposed on the first surface of the polysilicon layer, covering a first sub-portion of the first portion of the second dielectric layer.

3. The semiconductor structure of claim 2, wherein the first portion of the second dielectric layer further includes a second sub-portion exposed through the metal layer, and a thickness of the second sub-portion is less than a thickness of the first sub-portion.

4. The semiconductor structure of claim 2, wherein the second dielectric layer has a tapered configuration.

5. The semiconductor structure of claim 1, further comprising:
   a linear layer, disposed on the first surface of the polysilicon layer covering the bit line structure and the spacer structure to seal the gap.

6. The semiconductor structure of claim 1, wherein the thickness of the second portion of the second dielectric layer is less than the thickness of the first portion of the second dielectric layer by an amount in a range from 0.5 to 2 nanometers.

7. The semiconductor structure of claim 1, wherein the air gap has a width in a range from 3 to 5 nanometers.

8. The semiconductor structure of claim 1, wherein the thickness of the second portion of the first dielectric layer is in a range from 5.5 to 12 nanometers.

9. The semiconductor structure of claim 1, wherein the thickness of the second portion of the first dielectric layer is in a range from 4 to 10.5 nanometers.

* * * * *